United States Patent
Yoon et al.

(10) Patent No.: US 9,257,672 B2
(45) Date of Patent: Feb. 9, 2016

(54) ORGANIC LIGHT-EMITTING DISPLAY APPARATUS

(71) Applicant: SAMSUNG DISPLAY CO., LTD., Yongin, Gyeonggi-Do (KR)

(72) Inventors: Seok-Gyu Yoon, Yongin (KR); Kyu-Hwan Hwang, Yongin (KR); Dong-Chan Kim, Yongin (KR); Eung-Do Kim, Yongin (KR); Dong-Kyu Seo, Yongin (KR); Bo-Ra Jung, Yongin (KR); Won-Jong Kim, Yongin (KR); Young-Woo Song, Yongin (KR); Eui-Jin Yoo, Yongin (KR); Jong-Hyuk Lee, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/480,345

(22) Filed: Sep. 8, 2014

(65) Prior Publication Data
US 2015/0069359 A1    Mar. 12, 2015

(30) Foreign Application Priority Data

Sep. 9, 2013 (KR) .................. 10-2013-0108064
Jul. 31, 2014 (KR) .................. 10-2014-0098624

(51) Int. Cl.
*H01L 51/50* (2006.01)
*H01L 51/52* (2006.01)
*H01L 27/32* (2006.01)

(52) U.S. Cl.
CPC ............ *H01L 51/5253* (2013.01); *H01L 27/32* (2013.01); *H01L 27/3244* (2013.01); *H01L 51/5072* (2013.01); *H01L 51/5234* (2013.01)

(58) Field of Classification Search
CPC . H01L 51/5253; H01L 27/32; H01L 51/5072; H01L 27/3244
See application file for complete search history.

(56) References Cited

U.S. PATENT DOCUMENTS

| | | | |
|---|---|---|---|
| 8,018,137 B2 | 9/2011 | Shimoji et al. | |
| 8,455,867 B2 | 6/2013 | Kim et al. | |
| 2006/0290270 A1 | 12/2006 | Kim et al. | |
| 2007/0020483 A1 | 1/2007 | Park et al. | |
| 2007/0205717 A1* | 9/2007 | Yasukawa | 313/506 |
| 2009/0011278 A1 | 1/2009 | Choi et al. | |

FOREIGN PATENT DOCUMENTS

| | | |
|---|---|---|
| KR | 10-2007-0000262 A | 1/2007 |
| KR | 10-2007-0013002 A | 1/2007 |
| KR | 10-2007-0043293 A | 4/2007 |
| KR | 10-0838088 B1 | 6/2008 |
| KR | 10-2012-0043623 A | 5/2012 |
| WO | WO 2006/132226 A1 | 12/2006 |

OTHER PUBLICATIONS

W.F. Xie, et al., "Transparent organic light-emitting devices with LiF/Yb: Ag cathode", Thin Solid Films 515 (2007) 6975-6977.

\* cited by examiner

*Primary Examiner* — Roy Potter
*Assistant Examiner* — Paul Patton
(74) *Attorney, Agent, or Firm* — Lee & Morse, P.C.

(57) ABSTRACT

An organic light emitting display apparatus, including a first electrode; a second electrode on the first electrode, the second electrode including silver and magnesium; an organic emission layer between the first electrode and the second electrode; a metal layer between the organic emission layer and the second electrode; and a barrier layer between the organic emission layer and the second electrode.

82 Claims, 7 Drawing Sheets

ORGANIC LIGHT-EMITTING DISPLAY APPARATUS

CROSS-REFERENCE TO RELATED APPLICATION

Korean Patent Application No. 10-2013-0108064, filed on Sep. 9, 2013, and Korean Patent Application No. 10-2014-0098624, field on Jul. 31, 2014, in the Korean Intellectual Property Office, and entitled: "Organic Light-Emitting Display Apparatus," are incorporated by reference herein in their entirety.

BACKGROUND

1. Field

Embodiments relate to an organic light-emitting display apparatus.

2. Description of the Related Art

Recently, display apparatuses have been used for various purposes. For example, due to reduction of thickness and weight, display apparatuses are used more and more widely.

From among display apparatuses, an organic light-emitting display apparatus is a self-luminescent display apparatus with excellent characteristics including power consumption and image quality. Therefore, research has been made related to organic light-emitting display apparatuses.

An organic light emitting display apparatus may include a first electrode, a second electrode facing the first electrode, and an organic emission layer between the first electrode and the second electrode. When a voltage is applied to the first electrode and the second electrode, the organic emission layer emits visibly rays via recombination of holes and electrons.

SUMMARY

Embodiments are directed to an organic light-emitting display apparatus.

The embodiments may be realized by providing an organic light emitting display apparatus, including a first electrode; a second electrode on the first electrode, the second electrode including silver and magnesium; an organic emission layer between the first electrode and the second electrode; a metal layer between the organic emission layer and the second electrode; and a barrier layer between the organic emission layer and the second electrode.

The metal layer may include at least one selected from the group of ytterbium, samarium, calcium, strontium, europium, terbium, barium, lanthanum, and cesium.

The barrier layer may include a fluoride.

The fluoride may include at least one selected from the group of LiF, $CaF_2$, $NaF_2$ and $AlF_3$.

The barrier layer may include an oxide.

The oxide may include at least one selected from the group of CaO, LiO, MgO, ZnO, and ITO.

The barrier layer may include a halogen-containing compound.

A weight percent of silver in the second electrode may be greater than a weight percent of magnesium in the second electrode.

The metal layer may be closer to the second electrode than the barrier layer is to the second electrode.

The metal layer may contact the second electrode.

The barrier layer may be closer to the second electrode than the metal layer is to the second electrode.

The organic light emitting display apparatus may further include a buffer layer, the buffer layer being between the second electrode and the organic emission layer.

The buffer layer may be closer to the organic emission layer than the metal layer and the barrier layer are to the organic emission layer.

The buffer layer may include a fluoride.

The fluoride may include at least one selected from the group of LiF, $CaF_2$, $NaF_2$ and $AlF_3$.

The buffer layer may include an oxide.

The oxide may include at least one selected from the group of CaO, LiO, MgO, ZnO, and ITO.

The buffer layer may include a chloride.

The chloride may include RbCl.

The buffer layer may include an organic material.

The organic light emitting display apparatus may further include an electron transport layer, the electron transport layer being between the second electrode and the organic emission layer, wherein the metal layer and the barrier layer may be between the electron transport layer and the second electrode.

The organic light emitting display apparatus may further include a buffer layer, the buffer layer being between the organic emission layer and the electron transport layer.

The buffer layer may include at least one selected from the group of fluorides, oxides, chlorides, and organic materials.

The embodiments may be realized by providing an organic light emitting display apparatus including a first electrode; a second electrode on the first electrode, the second electrode including silver and magnesium; an organic emission layer between the first electrode and the second electrode; and a mixed layer between the organic emission layer and the second electrode, the mixed layer including a metal and a barrier material.

The metal may include at least one selected from the group of ytterbium, samarium, calcium, strontium, europium, terbium, barium, lanthanum, and cesium.

The barrier material may include a fluoride.

The fluoride may include at least one selected from the group of LiF, $CaF_2$, $NaF_2$ and $AlF_3$.

The barrier material may include an oxide.

The oxide may include at least one selected from the group of CaO, LiO, MgO, ZnO, and ITO.

The barrier material may include a halogen-containing compound.

A weight percent of silver in the second electrode may be greater than a weight percent of magnesium in the second electrode.

The organic light emitting display apparatus may further include a buffer layer, the buffer layer being between the organic emission layer and the second electrode.

The buffer layer may be closer to the organic emission layer than the mixed layer is to the organic emission layer.

The buffer layer may include a fluoride.

The fluoride may include at least one selected from the group of LiF, $CaF_2$, $NaF_2$ and $AlF_3$.

The buffer layer may include an oxide.

The oxide may include at least one selected from the group of CaO, LiO, MgO, ZnO, and ITO.

The buffer layer may include a chloride.

The chloride may include RbCl.

The buffer layer may include an organic material.

The organic light emitting display apparatus may further include an electron transport layer, the electron transport layer being between the second electrode and the organic emission layer, wherein the mixed layer is between the electron transport layer and the second electrode.

The organic light emitting display apparatus may further include a buffer layer, the buffer layer being between the organic emission layer and the electron transport layer.

The buffer layer may include at least one selected from the group of fluorides, oxides, chlorides, and organic materials.

The embodiments may be realized by providing an organic light emitting display apparatus comprising a plurality of pixels, wherein each pixel of the plurality of pixels includes a first electrode; a second electrode on the first electrode, the second electrode including silver and magnesium; an organic emission layer between the first electrode and the second electrode; a metal layer between the organic emission layer and the second electrode; and a barrier layer between the organic emission layer and the second electrode.

The barrier layer or the metal layer may be common to two or more pixels.

The barrier layer or the metal layer may be formed separately for each of the pixels.

Each of the pixels may include a thin-film transistor (TFT) electrically connected to the first electrode.

The metal layer may include at least one selected from the group of ytterbium, samarium, calcium, strontium, europium, terbium, barium, lanthanum, and cesium.

The barrier layer may include a fluoride.

The fluoride may include at least one selected from the group of LiF, $CaF_2$, $NaF_2$ and $AlF_3$.

The barrier layer may include an oxide.

The oxide may include at least one selected from the group of CaO, LiO, MgO, ZnO, and ITO.

The barrier layer may include a halogen-containing compound.

A weight percent of silver in the second electrode may be greater than a weight percent of magnesium in the second electrode.

The metal layer may be closer to the second electrode than the barrier layer is to the second electrode, and the metal layer may contact the second electrode.

The barrier layer may be closer to the second electrode than the metal layer is to the second electrode.

The organic light emitting display apparatus may further include a buffer layer, the buffer layer being between the second electrode and the organic emission layer.

The buffer layer may be closer to the organic emission layer than the metal layer and the barrier layer are to the organic emission layer.

The buffer layer may include a fluoride.

The fluoride may include at least one selected from the group of LiF, $CaF_2$, $NaF_2$ and $AlF_3$.

The buffer layer may include an oxide.

The oxide may include at least one selected from the group of CaO, LiO, MgO, ZnO, and ITO.

The buffer layer may include a chloride.

The chloride may include RbCl.

The buffer layer may include an organic material.

The embodiments may be realized by providing an organic light emitting display apparatus comprising a plurality of pixels, wherein each pixel of the plurality of pixels includes a first electrode; a second electrode on the first electrode, the second electrode including silver and magnesium; an organic emission layer between the first electrode and the second electrode; and a mixed layer between the organic emission layer and the second electrode, the mixed layer including a metal and a barrier material.

The metal may include at least one selected from the group of ytterbium, samarium, calcium, strontium, europium, terbium, barium, lanthanum, and cesium.

The barrier material may include a fluoride.

The fluoride may include at least one selected from the group of LiF, $CaF_2$, $NaF_2$ and $AlF_3$.

The barrier material may include an oxide.

The oxide may include at least one selected from the group of CaO, LiO, MgO, ZnO, and ITO.

The barrier material may include a halogen-containing compound.

A weight percent of silver in the second electrode may be greater than a weight percent of magnesium in the second electrode.

The organic light emitting display apparatus may further include a buffer layer, the buffer layer being between the second electrode and the organic emission layer.

The buffer layer may be closer to the organic emission layer than the mixed layer is to the organic emission layer.

The buffer layer may include a fluoride.

The fluoride may include at least one selected from the group of LiF, $CaF_2$, $NaF_2$ and $AlF_3$.

The buffer layer may include an oxide.

The oxide may include at least one selected from the group of CaO, LiO, MgO, ZnO, and ITO.

The buffer layer may include a chloride.

The chloride may include RbCl.

The buffer layer may include an organic material.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
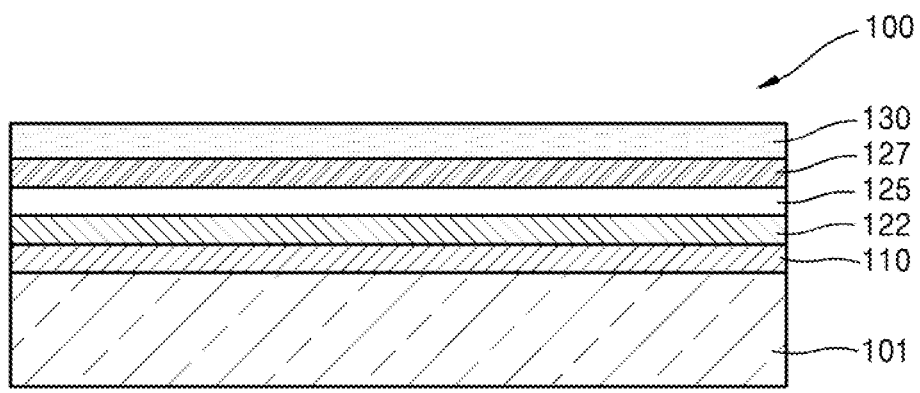
FIG. 1 illustrates a schematic sectional view of an organic light-emitting display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. For example, intervening layers, regions, or components may be present.

When a certain embodiment may be implemented differently, a specific process order may be performed differently from the described order. For example, two consecutively described processes may be performed substantially at the same time or performed in an order opposite to the described order.

FIG. 1 illustrates a schematic sectional view of an organic light-emitting display apparatus 100 according to an embodiment.

Referring to FIG. 1, the organic light-emitting display apparatus 100 according to the present embodiment may include a first electrode 110, a second electrode 130, an organic emission layer 122, a barrier layer 125, and a metal layer 127, that are formed on a substrate 101.

The substrate 101 may be formed of a transparent glass material. In an implementation, the substrate 101 may be formed of a flexible material, such as a transparent plastic or a metal thin-film.

The first electrode 110 and the second electrode 130 may be formed on the substrate 101. The organic emission layer 122 may be between the first electrode 110 and the second electrode 130. Although not shown, locations of the first electrode 110 and the second electrode 130 may be reversed. For example, the first electrode 110 may be arranged above the second electrode 130. If the first electrode 110 is arranged above the second electrode 130, the order in which members therebetween are stacked may also be changed.

In an implementation, the substrate 101 may be omitted, and the above-stated members may be directly arranged on the first electrode 110.

The first electrode 110 may function as an anode. If the first electrode 110 functions as an anode, the first electrode 110 may contain ITO, IZO, ZnO, or $In_2O_3$, which have high work functions. In an implementation, based on purposes or design conditions, the first electrode 110 may further include a reflective film formed of Ag, Mg, Al, Pt, Pd, Au, Ni, Nd, Ir, Cr, Li, Yb or Ca.

The organic emission layer 122 may be between the first electrode 110 and the second electrode 130. The organic emission layer 122 may be a layer that emits visible rays. For example, when voltages are applied to the first electrode 110 and the second electrode 130, the organic emission layer 122 may emit visible rays as holes and electrons therein are recombined.

The organic emission layer 122 may include any of various materials, e.g., a host and a dopant. The dopant may include a phosphor dopant or a phosphorescent dopant.

The second electrode 130 may be a cathode. The second electrode 130 may include AgMg. For example, the second electrode 130 may include Ag (silver) and Mg (magnesium). In an implementation, the second electrode 130 may include Ag as a main component and may include Mg as a sub component. For example, the second electrode 130 may include a greater amount of Ag than Mg, based on weight percentage (wt %).

For example, the second electrode 130 may include a greater amount of silver than magnesium, e.g., Ag as the main component, and light absorption of the second electrode 130 may be minimized and light reflection and light transmission of the second electrode 130 may be improved. Therefore, optical characteristics of the organic light-emitting display apparatus 100 may be improved, based on light resonance in the space between the first electrode 110 and the second electrode 130. For example, optical characteristics of the second electrode 130 may be maintained even if thickness of the second electrode 130 is minimized. Furthermore, resistance of the second electrode 130 may be minimized, thereby effectively maintaining electric characteristics of the second electrode 130.

In an implementation, the second electrode 130 may have a thickness of, e.g., about 30 Å to about 300 Å.

The metal layer 127 may be arranged between the second electrode 130 and the organic emission layer 122. The metal layer 127 may include at least one selected from among a group of Yb (ytterbium), Sm (samarium), Ca (calcium), Sr (strontium), Eu (europium), Tb (terbium), Ba (barium), La (lanthanum), Ce (cerium), and Cs (cesium). The metals included in the metal layer 127 are materials having low work functions, thereby improving electron injection characteristics from the second electrode 130 to the organic emission layer 122. For example, as noted above, the second electrode 130 is mainly formed of Ag, and a difference between work functions for electron injection to the organic emission layer 122 via the second electrode 130 may be significant. However, work functions of the materials included in the metal layer 127 may not be significantly different from that of Ag, which is the main or major component of the second electrode 130, electrons may flow smoothly from the second electrode 130 toward the metal layer 127. In an implementation, the metal layer 127 may contact the second electrode 130 to help improve characteristics of a flow of electrons from the second electrode 130 toward the metal layer 127 and a flow of electrons from the metal layer 127 toward the organic emission layer 122.

The metal layer 127 may be formed using any of various methods, e.g., a deposition.

The metal layer 127 may have a thickness of, e.g., about 5 Å to about 50 Å.

The barrier layer 125 may be between the second electrode 130 and the organic emission layer 122. In an implementation, the barrier layer 125 may be between the metal layer 127 and the organic emission layer 122.

The barrier layer 125 may include a barrier material, e.g., LiF. The barrier layer 125 may block migration of metals of the second electrode 130, e.g., Ag. The barrier layer 125 may primarily block migration of Ag of the second electrode 130 to the organic emission layer 122 and may secondarily block migration of Ag of the second electrode 130 to the first electrode 110.

In an implementation, the barrier layer 125 may contain various other materials. For example, LiF contained in the barrier layer 125 as stated above is merely an example, and the barrier layer 125 may contain various different fluorides. In an implementation, the barrier layer 125 may include at least one from a group of LiF, $CaF_2$, $NaF_2$ and $AlF_3$. For example, the fluoride may include a fluoride-containing compound or fluoride salt.

In an implementation, the barrier layer 125 may include, e.g., an oxide. For example, the barrier layer 125 may contain at least one from selected from the group of CaO, LiO, MgO, ZnO, and ITO.

In an implementation, the barrier layer 125 may include, e.g., a halogen-containing compound. For example, the barrier layer 125 may include RbBr, RbI, or RbCl.

When voltages are applied to the first electrode 110 and the second electrode 130 to operate the organic light-emitting display apparatus 100, the metal(s) of the second electrode 130, e.g., Ag and Mg, and more particularly, Ag may move toward the first electrode 110. In this case, if Ag were to reach the first electrode 110, a short circuit failure could occur between the first electrode 110 and the second electrode 130. If such a short circuit failure were to occur between the first electrode 110 and the second electrode 130, the organic emission layer between the first electrode 110 and the second electrode 130 may not be able to emit light normally.

The barrier layer 125 may be between the second electrode 130 and the first electrode 110, e.g., between the second electrode 130 and the organic emission layer 122.

The barrier layer 125 may help prevent metals of the second electrode 130 from migrating to the first electrode 110, may help prevent abnormal light emission or non-emission of the organic emission layer 122 by preventing metals of the second electrode 130 from migrating to the interface or the interior of the organic emission layer 122, and may help prevent the organic emission layer 122 from being damaged or polluted.

The barrier layer 125 may have a thickness of, e.g., about 5 Å to about 50 Å.

According to an embodiment, the organic light-emitting display apparatus 100 with high efficiency and improved electron injection characteristics from the second electrode 130 to the 140 may be embodied by arranging the metal layer 127 containing at least one a group of Yb (ytterbium), Sm (samarium), Ca (calcium), Sr (strontium), Eu (europium), Tb (terbium), Ba (barium), La (lanthanum), Ce (cerium), and Cs (cesium) between the second electrode 130 and the organic emission layer 122.

For example, the second electrode 130 may include Ag as the major component to help improve optical characteristics. Here, a difference in work functions between the second electrode 130 and a layer adjacent thereto, e.g., the organic emission layer 122, may increase, and thus electron injection characteristics to the organic emission layer 122 may be deteriorated. However, according to an embodiment, such an issue may be overcome by arranging the metal layer 127 containing a material having a work function similar to that of Ag, where the material is at least one selected from the group of Yb (ytterbium), Sm (samarium), Ca (calcium), Sr (strontium), Eu (europium), Tb (terbium), Ba (barium), La (lanthanum), and Ce (cesium).

In an implementation, the barrier layer 125 may include various oxides, fluorides, or halogen-containing compounds, and the barrier layer 125 may be arranged between the second electrode 130 and the organic emission layer 122. The second electrode 130 may help prevent migration of metals by using the barrier layer 125, thereby suppressing a short circuit failure between the first electrode 110 and the second electrode 130 and abnormal light emission of the organic emission layer 122. For example, an oxide, a fluoride, or a halogen-containing compound may contain a material having a strong covalent bond, and metals of the second electrode 130 may not easily spread. Accordingly, metals of the second electrode 130 may be prevented from migrating past the barrier layer 125.

As a result, the organic light-emitting display apparatus 100 according to the present embodiment may exhibit improved optical and electric characteristics.

Figure 2:
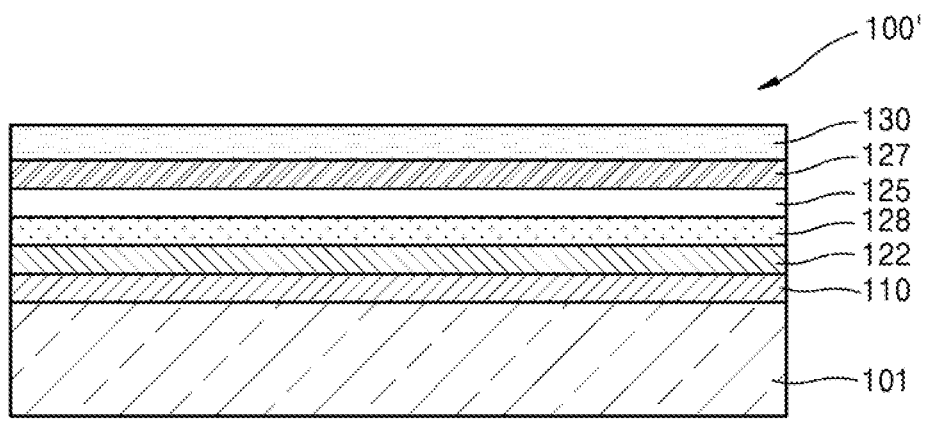
FIG. 2 illustrates a schematic sectional diagram showing a modified example of the organic light-emitting display apparatus shown in FIG. 1.

FIG. 2 illustrates a schematic sectional diagram showing a modified example of the organic light-emitting display apparatus 100 of FIG. 1.

For convenience of explanation, descriptions given below will focus on differences between the embodiment shown in FIG. 1 and the embodiment shown in FIG. 2. Like reference numerals denote like elements, and thus repeated detailed descriptions thereof may be omitted.

Referring to FIG. 2, compared to the organic light-emitting display apparatus 100 of FIG. 1, an organic light-emitting display apparatus 100' may further include a buffer layer 128.

The buffer layer 128 may be arranged between the second electrode 130 and the organic emission layer 122. In an implementation, the buffer layer 128 may be closer to the organic emission layer 122 than the barrier layer 125 and the metal layer 127 are to the organic emission layer. For example, the buffer layer 128 may be arranged between the organic emission layer 122 and the barrier layer 125.

The buffer layer 128 may contain various materials. For example, the buffer layer 128 may contain a fluoride. In an implementation, the buffer layer 128 may contain at least one selected from the group of LiF, $CaF_2$, $NaF_2$ and $AlF_3$.

For example, the buffer layer 128 may contain an oxide. In an implementation, the buffer layer 128 may contain at least one selected from the group of CaO, LiO, MgO, ZnO, and ITO.

For example, the buffer layer 128 may contain a chloride. In an implementation, the buffer layer 128 may contain RbCl.

For example, the buffer layer 128 may contain an organic material. In an implementation, the buffer layer 128 may contain a material selected from among compounds represented by Formula 1 below.

<Formula 1>

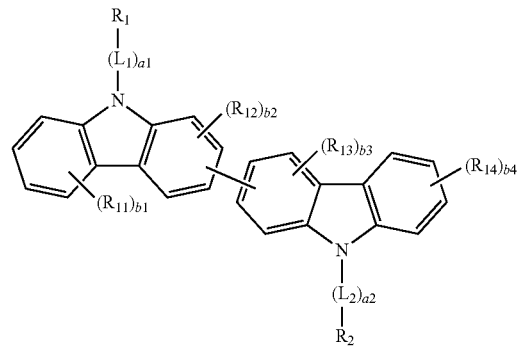

$L_1$ and $L_2$ in Formula 1 may be each independently selected from a substituted or unsubstituted $C_3$-$C_{10}$ cycloalkylene group, a substituted or unsubstituted $C_3$-$C_{10}$ heterocycloalkylene group, a substituted or unsubstituted $C_3$-$C_{10}$ cycloalkenylene group, a substituted or unsubstituted $C_3$-$C_{10}$ heterocycloalkenylene group, a substituted or unsubstituted $C_6$-$C_{60}$ arylene group, a substituted or unsubstituted $C_2$-$C_{60}$ heteroarylene group, a substituted or unsubstituted divalent non-aromatic condensed polycyclic group, and a substituted or unsubstituted divalent non-aromatic hetero-condensed polycyclic group, at least one substituent of the substituted $C_3$-$C_{10}$ cycloalkylene, the substituted $C_3$-$C_{10}$ heterocycloalkylene, the substituted $C_3$-$C_{10}$ cycloalkenylene, the substituted $C_3$-$C_{10}$ heterocycloalkenylene, the substituted $C_6$-$C_{60}$ arylene, the substituted $C_2$-$C_{60}$ heteroarylene, the substituted divalent non-aromatic condensed polycyclic group, and the substituted divalent non-aromatic hetero-condensed polycyclic group may be selected from a deuterium, a halogen atom, a hydroxyl, a cyano, a nitro, an amino, an amidino, a hydrazine, a hydrazone, a carboxylic acid and a salt thereof, a sulfonic acid and a salt thereof, a phosphoric acid and a salt thereof, a $C_1$-$C_{60}$ alkyl, a $C_2$-$C_{60}$ alkenyl, a $C_2$-$C_{60}$ alkynyl, and a $C_1$-$C_{60}$ alkoxy; a $C_1$-$C_{60}$ alkyl, a $C_2$-$C_{60}$ alkenyl, a $C_2$-$C_{60}$ alkynyl, and a $C_1$-$C_{60}$ alkoxy, each substituted with at least one selected from a deuterium, a halogen atom, a hydroxyl, a cyano, a nitro, an amino, an amidino, a hydrazine, a hydrazone, a carboxylic acid and a salt thereof, a sulfonic acid and a salt thereof, a phosphoric acid and a salt thereof, a $C_3$-$C_{10}$ cycloalkyl, a $C_3$-$C_{10}$ heterocycloalkyl, a $C_3$-$C_{10}$ cycloalkenyl, a $C_3$-$C_{10}$ heterocycloalkenyl, a $C_6$-$C_{60}$ aryl, a $C_6$-$C_{60}$ aryloxy, a $C_6$-$C_{60}$ arylthio, a $C_2$-$C_{60}$ heteroaryl, a non-aromatic condensed polycyclic, a non-aromatic condensed heteropolycyclic, —N($Q_1$)($Q_2$), —Si($Q_3$)($Q_4$)($Q_5$), and —B($Q_6$)($Q_7$); a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arythio group, a $C_2$-$C_{60}$ heteroaryl group, a non-aromatic condensed polycyclic group, and a non-aromatic condensed heteropolycyclic group; a $C_3$-$C_{10}$ cycloalkyl, a $C_3$-$C_{10}$ heterocycloalkyl, a $C_3$-$C_{10}$ cycloalkenyl, a $C_3$-$C_{10}$ heterocycloalkenyl, a $C_6$-$C_{60}$ aryl, a $C_6$-$C_{60}$ aryloxy, a $C_6$-$C_{60}$ arythio, a $C_2$-$C_{60}$ heteroaryl, a non-aromatic condensed polycyclic group, and a non-aromatic condensed heteropolycyclic group, each substituted with at least one selected from a deuterium, a halogen atom, a hydroxyl, a cyano, a nitro, an amino, an amidino, a hydrazine, a hydrazone, a carboxylic acid and a salt thereof, a sulfonic acid and a salt thereof, a phosphoric acid and a salt thereof, a $C_1$-$C_{60}$ alkyl, a $C_2$-$C_{60}$ alkenyl, a $C_2$-$C_{60}$ alkynyl, a $C_1$-$C_{60}$ alkoxy, a $C_3$-$C_{10}$ cycloalkyl, a $C_3$-$C_{10}$ heterocycloalkyl, a $C_3$-$C_{10}$ cycloalkenyl, a $C_3$-$C_{10}$ heterocycloalkenyl, a $C_6$-$C_{60}$ aryl, a $C_6$-$C_{60}$ aryloxy, a $C_6$-$C_{60}$ arythio, a $C_2$-$C_{60}$ heteroaryl, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$); and —N($Q_{21}$)($Q_{22}$), —Si($Q_{23}$)($Q_{24}$)($Q_{25}$), and —B($Q_{26}$)($Q_{27}$).

For example, $L_1$ and $L_2$ in Formula 1 may be each independently selected from phenylene, pentalenylene, indenylene, naphthylene, azulenylene, heptalenylene, indacenylene, acenaphthylene, fluorenylene, spiro-fluorenylene, benzofluorenylene, dibenzofluorenylene, phenalenylene, phenanthrenylene, anthracenylene, fluoranthenylene, triphenylenylene, pyrenylene, chrysenylene, naphthacenylene, picenylene, perylenylene, pentaphenylene, hexacenylene, pentacenylene, rubicenylene, coronenylene, ovalenylene, pyrrolylene, thiophenylene, furanylene, imidazolylene, pyrazolylene, thiazolylene, isothiazolylene, oxazolylene, isooxazolylene, pyridinylene, pyrazinylene, pyrimidinylene, pyridazinylene, isoindolylene, indolylene, indazolylene, purinylene, quinolinylene, isoquinolinylene, benzoquinolinylene, phthalazinylene, naphthyridinylene, quinoxalinylene, quinazolinylene, cinnolinylene, carbazolylene, phenanthridinylene, acridinylene, phenanthrolinylene, phenazinylene, benzoimidazolylene, benzofuranylene, benzothiophenylene, isobenzothiazolylene, benzooxazolylene, isobenzooxazolylene, triazolylene, tetrazolylene, oxadiazolylene, triazinylene, dibenzofuranylene, dibenzothiophenylene, benzocarbazolylene, and dibenzocarbazolylene; and phenylene, pentalenylene, indenylene, naphthylene, azulenylene, heptalenylene, indacenylene, acenaphthylene, fluorenylene, spiro-fluorenylene, benzofluorenylene, dibenzofluorenylene, phenalenylene, phenanthrenylene, anthracenylene, fluoranthenylene, triphenylenylene, pyrenylene, chrysenylene, naphthacenylene, picenylene, perylenylene, pentaphenylene, hexacenylene, pentacenylene, rubicenylene, coronenylene, ovalenylene, pyrrolylene, thiophenylene, furanylene, imidazolylene, pyrazolylene, thiazolylene, isothiazolylene, oxazolylene, isooxazolylene, pyridinylene, pyrazinylene, pyrimidinylene, pyridazinylene, isoindolylene, indolylene, indazolylene, purinylene, quinolinylene, isoquinolinylene, benzoquinolinylene, phthalazinylene, naphthyridinylene, quinoxalinylene, quinazolinylene, cinnolinylene, carbazolylene, phenanthridinylene, acridinylene, phenanthrolinylene, phenazinylene, benzoimidazolylene, benzofuranylene, benzothiophenylene, isobenzothiazolylene, benzooxazolylene, isobenzooxazolylene, triazolylene, tetrazolylene, oxadiazolylene, triazinylene, dibenzofuranylene, dibenzothiophenylene, benzocarbazolylene, and dibenzocarbazolylene, each substituted with at least one selected from deuterium, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{20}$ alkyl, a $C_1$-$C_{20}$ alkoxy, cyclopentyl, cyclohexyl, cycloheptyl, cyclopentenyl, cyclohexenyl, phenyl, pentalenyl, indenyl, naphthyl, azulenyl, heptalenyl, indacenyl, acenaphthyl, fluorenyl, spiro-fluorenyl, benzofluorenyl, dibenzofluorenyl, phenalenyl, phenanthrenyl, anthracenyl, fluorantenyl, triphenylenyl, pyrenyl, chrysenyl, naphthacenyl, pycenyl, perylenyl, pentaphenyl, hexacenyl, pentacenyl, rubicenyl, coronenyl, ovalenyl, pyrrolyl, thiophenyl, furanyl, imidazolyl, pyrazolyl, thiazolyl, isothiazolyl, oxazolyl, isooxazolyl, pyridinyl, pyrazinyl, pyrimidinyl, pyridazinyl, isoindolyl, indolyl, indazolyl, purinyl, quinolinyl, isoquinolinyl, benzoquinolinyl, phthalazinyl, naphthyridinyl, quinoxalinyl, quinazolinyl, cinnolinyl, carbazolyl, phenanthridinyl, acridinyl, phenanthrolinyl, phenazinyl, benzoimidazolyl, benzofuranyl, benzothiophenyl, isobenzothiazolyl, benzooxazolyl, isobenzooxazolyl, triazolyl, tetrazolyl, oxadiazolyl, triazinyl, dibenzofuranyl, dibenzothiophenyl, benzocarbazolyl, and dibenzocarbazolyl.

In an implementation, $L_1$ and $L_2$ in Formula 1 may be each independently groups represented by one of Formulae 3-1 to 3-32 below:

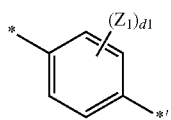
Formula 3-1
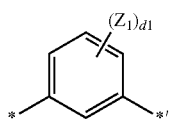
Formula 3-2
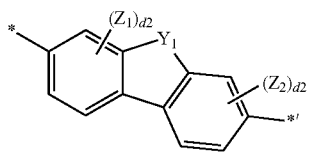
Formula 3-3
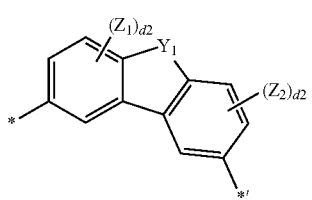
Formula 3-4
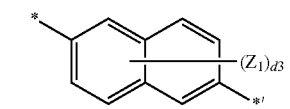
Formula 3-5
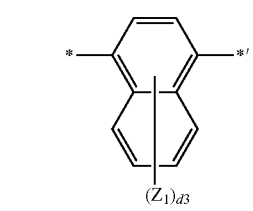
Formula 3-6
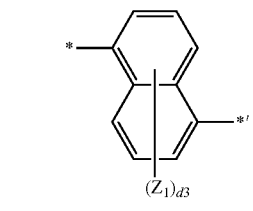
Formula 3-7
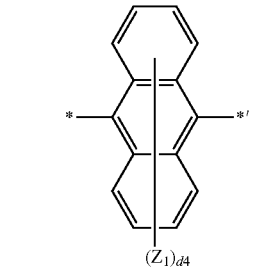
Formula 3-8
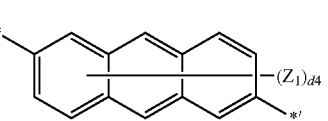
Formula 3-9
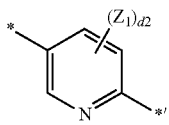
Formula 3-10
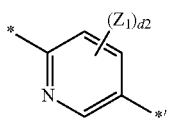
Formula 3-11
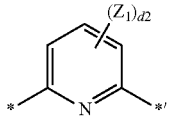
Formula 3-12
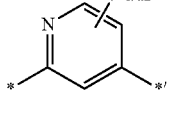
Formula 3-13
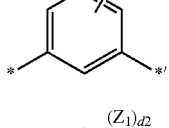
Formula 3-14
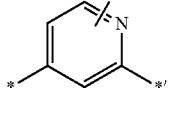
Formula 3-15
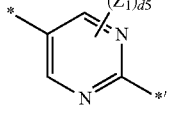
Formula 3-16
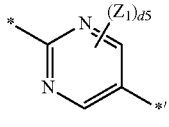
Formula 3-17
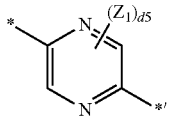
Formula 3-18
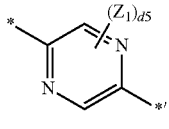
Formula 3-19
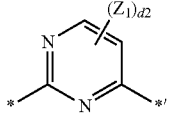
Formula 3-20
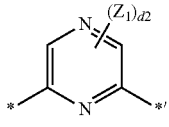
Formula 3-21

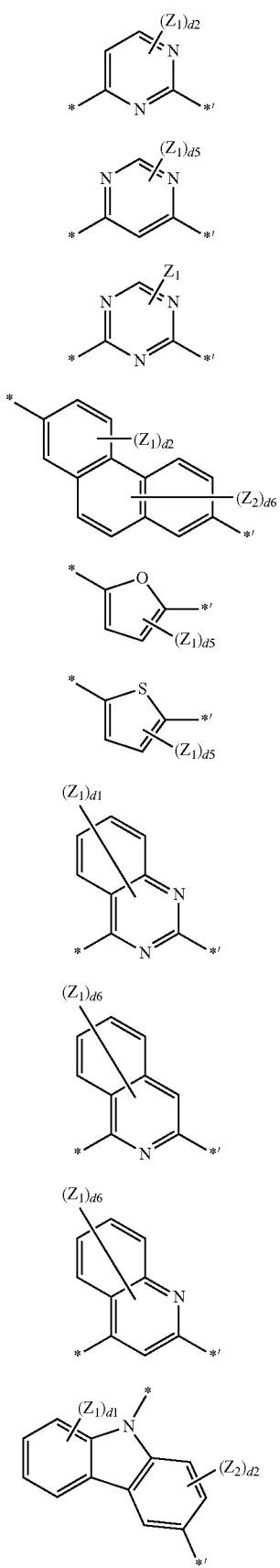

Formula 3-22

Formula 3-23

Formula 3-24

Formula 3-25

Formula 3-26

Formula 3-27

Formula 3-28

Formula 3-29

Formula 3-30

Formula 3-31

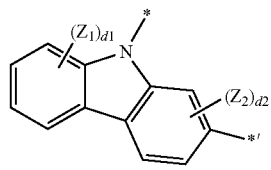

Formula 3-32

In Formulae 3-1 to 3-32, $Z_1$ and $Z_2$ may be each independently selected from a hydrogen, a deuterium, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, d1 is an integer selected from 1 to 4; and d2 is an integer selected from 1 to 3; d3 is an integer selected from 1 to 6; d4 is selected from an integer of 1 to 8; and d5 is 1 or 2; d6 is selected from an integer of 1 to 5; and * and *' represent binding sites to neighboring atoms.

In an implementation, $L_1$ and $L_2$ in Formula 1 may be each independently groups represented by one of Formulae 4-1 to 4-25, in which * and *' represent binding sites to neighboring atoms.

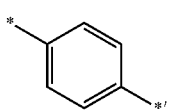

Formula 4-1

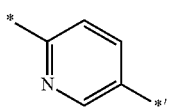

Formula 4-2

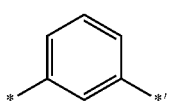

Formula 4-3

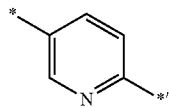

Formula4-4

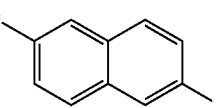

Formula 4-5

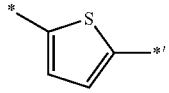

Formula 4-6

Formula 4-7
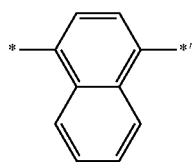
Formula 4-8
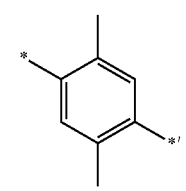
Formula 4-9
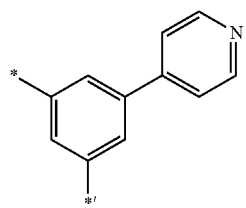
Formula 4-10
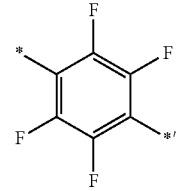
Formula 4-11
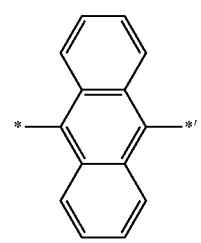
Formula 4-12
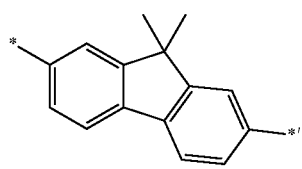
Formula 4-13
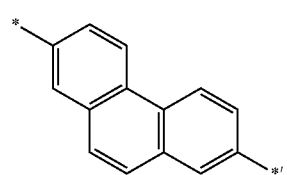
Formula 4-14
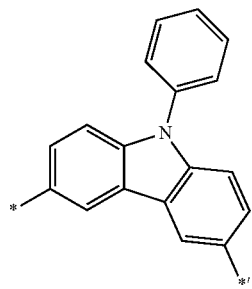
Formula 4-15
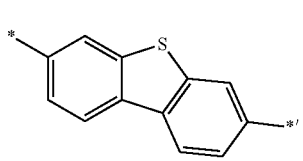
Formula 4-16
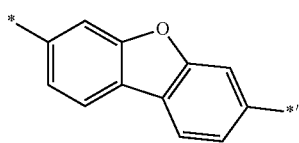
Formula 4-17
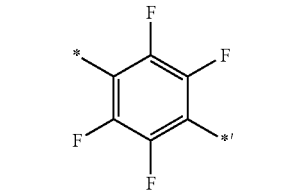
Formula 4-18
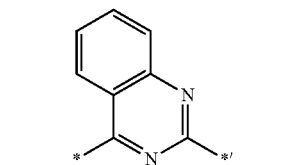
Formula 4-19
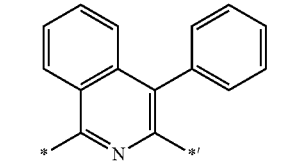
Formula 4-20
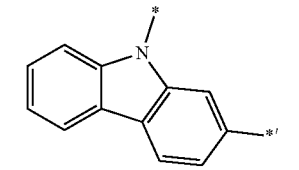
Formula 4-21
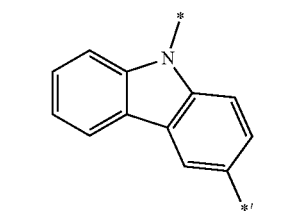

Formula 4-22

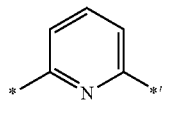

Formula 4-23

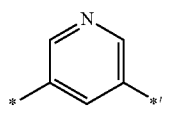

Formula 4-24

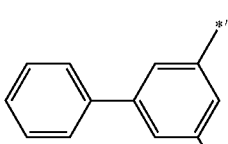

Formula 4-25

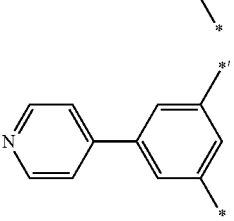

a1 in Formula 1 indicates the number of $L_1$ and may be selected from 0, 1, 2 and 3. When a1 is 0, $R_1$ may directly bind to N. When a1 is 2 or more, a plurality of $L_1$ may be identical or different. For example, a1 may be 0 or 1.

a2 in Formula 1 indicates the number of $L_2$ and may be selected from 0, 1, 2 and 3. When a2 is 0, $R_2$ may directly bind to N. When a2 is 2 or more, a plurality of $L_2$ may be identical or different. For example, a2 may be 0 or 1, wherein $R_1$ and $R_2$ in Formula 1 may be each independently selected from a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arythio group, a $C_2$-$C_{60}$ heteroaryl group, a monovalent non-aromatic condensed polycyclic group, and a monovalent non-aromatic condensed heteropolycyclic group; and a $C_3$-$C_{10}$ cycloalkyl, a $C_3$-$C_{10}$ heterocycloalkyl, a $C_3$-$C_{10}$ cycloalkenyl, a $C_3$-$C_{10}$ heterocycloalkenyl, a $C_6$-$C_{60}$ aryl, a $C_6$-$C_{60}$ aryloxy, a $C_6$-$C_{60}$ arythio, a $C_2$-$C_{60}$ heteroaryl, a monovalent non-aromatic condensed polycyclic group, and a monovalent non-aromatic condensed heteropolycyclic group, each substituted with at least one selected from a deuterium, a halogen atom, a hydroxyl, a cyano, a nitro, an amino, an amidino, a hydrazine, a hydrazone, a carboxylic acid and a salt thereof, a sulfonic acid and a salt thereof, a phosphoric acid and a salt thereof, a $C_1$-$C_{60}$ alkyl, a $C_2$-$C_{60}$ alkenyl, a $C_2$-$C_{60}$ alkynyl, a $C_1$-$C_{60}$ alkoxy, a $C_3$-$C_{10}$ cycloalkyl, a $C_3$-$C_{10}$ heterocycloalkyl, a $C_3$-$C_{10}$ cycloalkenyl, a $C_3$-$C_{10}$ heterocycloalkenyl, a $C_6$-$C_{60}$ aryl, a $C_6$-$C_{60}$ aryloxy, a $C_6$-$C_{60}$ arythio, a $C_2$-$C_{60}$ heteroaryl, a non-aromatic condensed polycyclic group, a non-aromatic condensed heteropolycyclic group, —N($Q_{31}$)($Q_{32}$), —Si($Q_{33}$)($Q_{34}$)($Q_{35}$), and —B($Q_{36}$)($Q_{37}$).

For example, $R_1$ and $R_2$ in Formula 1 may be each independently groups selected from phenyl, pentalenyl, indenyl, naphthyl, azulenyl, heptalenyl, indacenyl, acenaphthyl, fluorenyl, spiro-fluorenyl, benzofluorenyl, dibenzofluorenyl, phenalenyl, phenanthrenyl, anthracenyl, fluoranthenyl, triphenylenyl, pyrenyl, chrysenyl, naphthacenyl, picenyl, perylenyl, pentaphenyl, hexacenyl, pentacenyl, rubicenyl, coronenyl, ovalenyl, pyrrolyl, thiophenyl, furanyl, imidazolyl, pyrazolyl, thiazolyl, isothiazolyl, oxazolyl, isooxazolyl, pyridinyl, pyrazinyl, pyrimidinyl, pyridazinyl, isoindolyl, indolyl, indazolyl, purinyl, quinolinyl, isoquinolinyl, benzoquinolinyl, phthalazinyl, naphthyridinyl, quinoxalinyl, quinazolinyl, cinnolinyl, carbazolyl, phenanthridinyl, acridinyl, phenanthrolinyl, phenazinyl, benzoimidazolyl, benzofuranyl, benzothiophenyl, isobenzothiazolyl, benzooxazolyl, isobenzooxazolyl, triazolyl, tetrazolyl, oxadiazolyl, triazinyl, dibenzofuranyl, dibenzothiophenyl, benzocarbazolyl, and dibenzocarbazolyl; and a phenyl group, a pentalenyl group, a indenyl group, a naphthyl group, a azulenyl group, a heptalenyl group, a indacenyl group, a acenaphthyl group, a fluorenyl group, a spiro-fluorenyl group, a benzofluorenyl group, a dibenzofluorenyl group, a phenalenyl group, a phenanthrenyl group, a anthracenyl group, a fluorantenyl group, a triphenylenyl group, a pyrenyl group, a chrysenyl group, a naphthacenyl group, a pycenyl group, a perylenyl group, a pentaphenyl group, a hexacenyl group, a pentacenyl group, a rubicenyl group, a coronenyl group, a ovalenyl group, a pyrrolyl group, a thiophenyl group, a furanyl group, a imidazolyl group, a pyrazolyl group, a thiazolyl group, a isothiazolyl group, a oxazolyl group, a isooxazolyl group, a pyridinyl group, a pyrazinyl group, a pyrimidinyl group, a pyridazinyl group, a isoindolyl group, a indolyl group, a indazolyl group, a purinyl group, a quinolinyl group, a isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, a acridinyl group, a phenanthrolinyl group, a phenazinyl group, a benzoimidazolyl group, a benzofuranyl group, a benzothiophenyl group, a isobenzothiazolyl group, a benzooxazolyl group, a isobenzooxazolyl group, a triazolyl group, a tetrazolyl group, a oxadiazolyl group, a triazinyl group, a dibenzofuranyl group, a dibenzothiophenyl group, a benzocarbazolyl group, and a dibenzocarbazolyl group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{20}$ alkyl group, a $C_1$-$C_{20}$ alkoxy group, —Si($Q_{33}$)($Q_{20}$)($Q_{35}$), a phenyl group, a pentalenyl group, a indenyl group, a naphthyl group, a azulenyl group, a heptalenyl group, a indacenyl group, a acenaphthyl group, a fluorenyl group, a spiro-fluorenyl group, a benzofluorenyl group, a dibenzofluorenyl group, a phenalenyl group, a phenanthrenyl group, a anthracenyl group, a fluorantenyl group, a triphenylenyl group, a pyrenyl group, a chrysenyl group, a naphthacenyl group, a pycenyl group, a perylenyl group, a pentaphenyl group, a hexacenyl group, a pentacenyl group, a rubicenyl group, a coronenyl group, a ovalenyl group, a pyrrolyl group, a thiophenyl group, a furanyl group, a imidazolyl group, a pyrazolyl group, a thiazolyl group, a isothiazolyl group, a oxazolyl group, a isooxazolyl group, a pyridinyl group, a pyrazinyl group, a pyrimidinyl group, a pyridazinyl group, a isoindolyl group, a indolyl group, a indazolyl group, a purinyl group, a quinolinyl group, a isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, a acridinyl group, a phenanthrolinyl group, a phenazinyl group, a benzoimidazolyl group, a benzofuranyl group, a benzothiophenyl group, a isobenzothiazolyl group, a benzooxazolyl group, a isobenzooxazolyl group, a triazolyl group, a tetrazolyl group, a oxadiazolyl group, a triazinyl group, a dibenzofuranyl group, a dibenzothiophenyl group, a benzocarbazolyl group, a dibenzocarbazolyl group, a thiadiazolyl group, and imidazopyridinyl group, but they are not limited thereto.

In an implementation, $R_1$ and $R_2$ in Formula 1 may be each independently selected from a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, but are not limited thereto.

$R_{11}$ to $R_{14}$ in Formula 1 may be each independently selected from a hydrogen, a deuterium, a halogen atom, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group; a $C_1$-$C_{60}$ alkyl, a $C_2$-$C_{60}$ alkenyl, a $C_2$-$C_{60}$ alkynyl, and a $C_1$-$C_{60}$ alkoxy, each substituted with at least one selected from a deuterium, a halogen atom, a hydroxyl, a cyano, a nitro, an amino, an amidino, a hydrazine, a hydrazone, a carboxylic acid and a salt thereof, a sulfonic acid and a salt thereof, a phosphoric acid and a salt thereof, a $C_3$-$C_{10}$ cycloalkyl, a $C_3$-$C_{10}$ heterocycloalkyl, a $C_3$-$C_{10}$ cycloalkenyl, a $C_3$-$C_{10}$ heterocycloalkenyl, a $C_6$-$C_{60}$ aryl, a $C_6$-$C_{60}$ aryloxy, a $C_6$-$C_{60}$ arylthio, a $C_2$-$C_{60}$ heteroaryl, a non-aromatic condensed polycyclic, a non-aromatic condensed heteropolycyclic, —$N(Q_{41})(Q_{42})$, —$Si(Q_{43})(Q_{44})(Q_{45})$, and —$B(Q_{46})(Q_{47})$; a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arythio group, a $C_2$-$C_{60}$ heteroaryl group, a non-aromatic condensed polycyclic group, and a non-aromatic condensed heteropolycyclic group; a $C_3$-$C_{10}$ cycloalkyl, a $C_3$-$C_{10}$ heterocycloalkyl, a $C_3$-$C_{10}$ cycloalkenyl, a $C_3$-$C_{10}$ heterocycloalkenyl, a $C_6$-$C_{60}$ aryl, a $C_6$-$C_{60}$ aryloxy, a $C_6$-$C_{60}$ arythio, a $C_2$-$C_{60}$ heteroaryl, a non-aromatic condensed polycyclic group, and a non-aromatic condensed heteropolycyclic group, each substituted with at least one selected from a deuterium, a halogen atom, a hydroxyl, a cyano, a nitro, an amino, an amidino, a hydrazine, a hydrazone, a carboxylic acid and a salt thereof, a sulfonic acid and a salt thereof, a phosphoric acid and a salt thereof, a $C_1$-$C_{60}$ alkyl, a $C_2$-$C_{60}$ alkenyl, a $C_2$-$C_{60}$ alkynyl, a $C_1$-$C_{60}$ alkoxy, a $C_3$-$C_{10}$ cycloalkyl, a $C_3$-$C_{10}$ heterocycloalkyl, a $C_3$-$C_{10}$ cycloalkenyl, a $C_3$-$C_{10}$ heterocycloalkenyl, a $C_6$-$C_{60}$ aryl, a $C_6$-$C_{60}$ aryloxy, a $C_6$-$C_{60}$ arythio, a $C_2$-$C_{60}$ heteroaryl, a monovalent non-aromatic condensed polycyclic group, a monovalent non-aromatic condensed heteropolycyclic group, —$N(Q_{51})(Q_{52})$, —$Si(Q_{53})(Q_{54})(Q_{55})$, and —$B(Q_{56})(Q_{57})$; and —$N(Q_{61})(Q_{62})$, —$Si(Q_{63})(Q_{64})(Q_{65})$, and —$B(Q_{66})(Q_{67})$.

$Q_1$ to $Q_7$, $Q_{11}$ to $Q_{17}$, $Q_{21}$ to $Q_{27}$, $Q_{31}$ to $Q_{37}$, $Q_{41}$ to $Q_{47}$, $Q_{51}$ to $Q_{57}$, and $Q_{61}$ to $Q_{67}$ used herein may be each independently selected from a hydrogen, a deuterium, a halogen atom, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group; a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, a halogen atom, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arythio group, a $C_2$-$C_{60}$ heteroaryl group, a non-aromatic condensed polycyclic group, and a non-aromatic condensed heteropolycyclic group; a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arythio group, a $C_2$-$C_{60}$ heteroaryl group, a monovalent non-aromatic condensed polycyclic group, and a monovalent non-aromatic condensed heteropolycyclic group; and a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arythio group, a $C_2$-$C_{60}$ heteroaryl group, a non-aromatic condensed polycyclic group, and a non-aromatic condensed heteropolycyclic group, each substituted with at least one selected from a deuterium, a halogen atom, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arythio group, a $C_2$-$C_{60}$ heteroaryl group, a non-aromatic condensed polycyclic group, and a non-aromatic condensed heteropolycyclic group.

For example, $R_{11}$ to $R_{14}$ in Formula 1 may be each independently selected from a hydrogen, a deuterium, a halogen atom, a hydroxyl group, a cyano group, a nitro group, an amino group, an amidino group, a hydrazine group, a hydrazone group, a carboxylic acid group and a salt thereof, a sulfonic acid and a salt thereof, a phosphoric acid and a salt thereof, a $C_1$-$C_{20}$ alkyl group, and a $C_1$-$C_{20}$ alkoxy group; a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, but are not limited thereto.

In an implementation, $R_{11}$ to $R_{14}$ in Formula 1 may be each independently selected from a $C_1$-$C_{20}$ alkyl and a $C_1$-$C_{20}$ alkoxy; a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and phenyl, naphthyl, fluorenyl, spiro-fluorenyl, benzofluorenyl, dibenzofluorenyl, phenanthrenyl, anthracenyl, pyrenyl, chrysenyl, pyridinyl, pyrazinyl, pyrimidinyl, pyridazinyl, quinolinyl, isoquinolinyl, quinoxalinyl, quinazolinyl, carbazolyl, and triazinyl, each substituted with at least one selected from deuterium, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{20}$ alkyl, a $C_1$-$C_{20}$ alkoxy, phenyl, naphthyl, fluorenyl, spiro-fluorenyl, benzofluorenyl, dibenzofluorenyl, phenanthrenyl, anthracenyl, pyrenyl, chrysenyl, pyridinyl, pyrazinyl, pyrimidinyl, pyridazinyl, quinolinyl, isoquinolinyl, quinoxalinyl, quinazolinyl, carbazolyl, and triazinyl.

b1 in Formula 1 indicates the number of $R_{11}$ and may be selected from 0, 1, 2 and 3. When b1 is 2 or more, a plurality of $R_{11}$ may be identical or different. For example, b1 may be 0 or 1, but is not limited thereto Descriptions of each of b2 to b4 are as described in the description of b1.

In an implementation, the buffer layer 128 may include a compound selected from Compounds 1 to 11 below, but the compound therefor is not limited thereto:

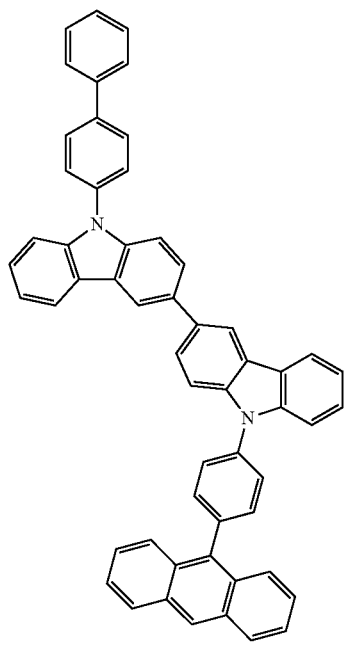

1

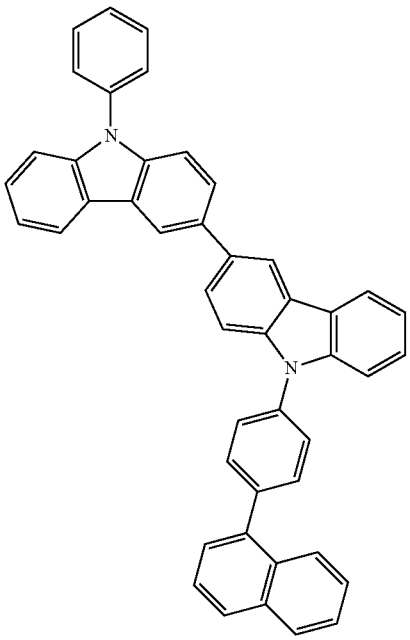

2

3

-continued
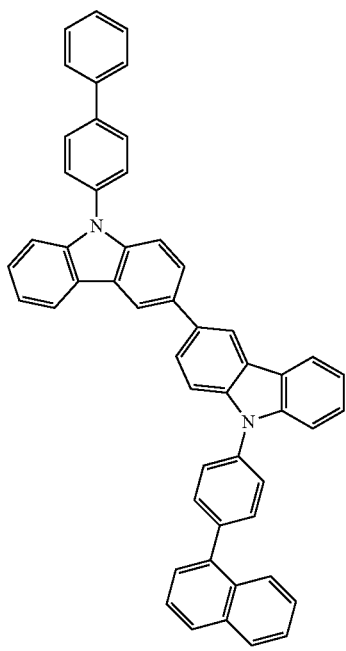
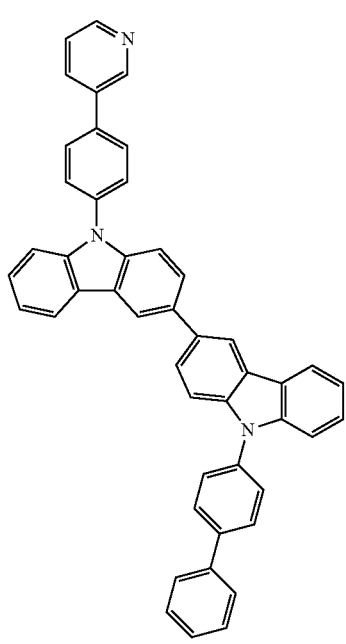
-continued
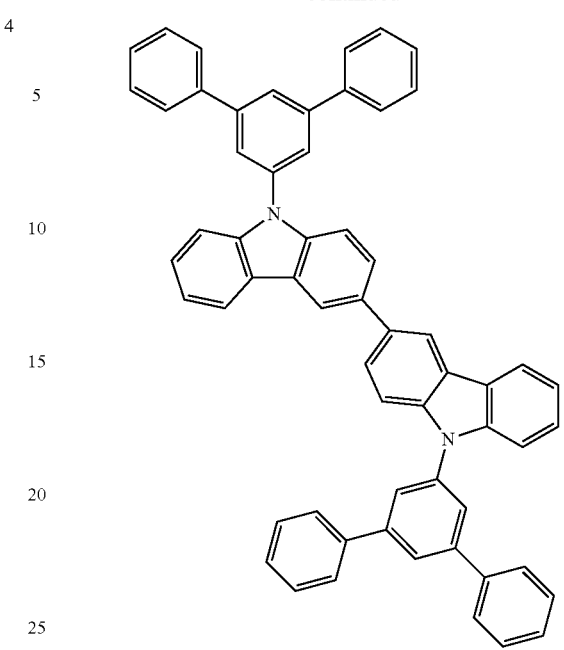
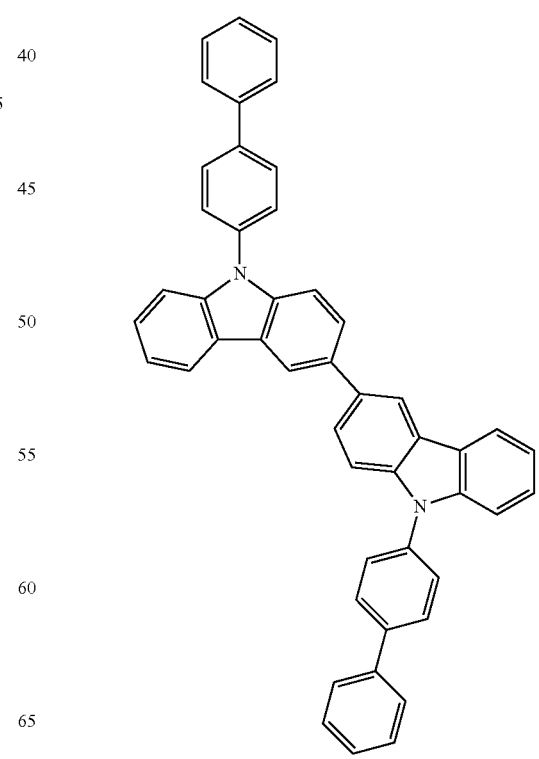

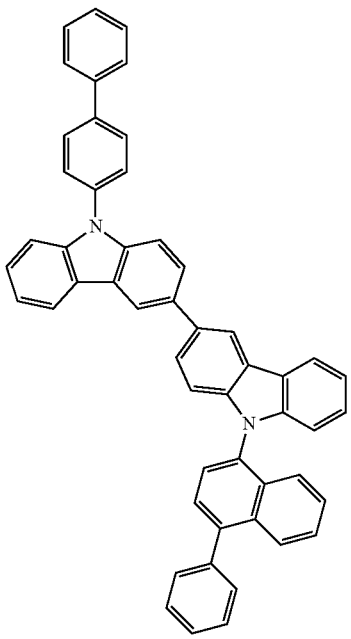

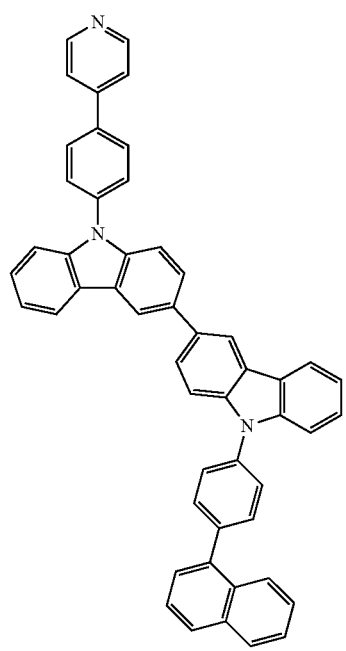

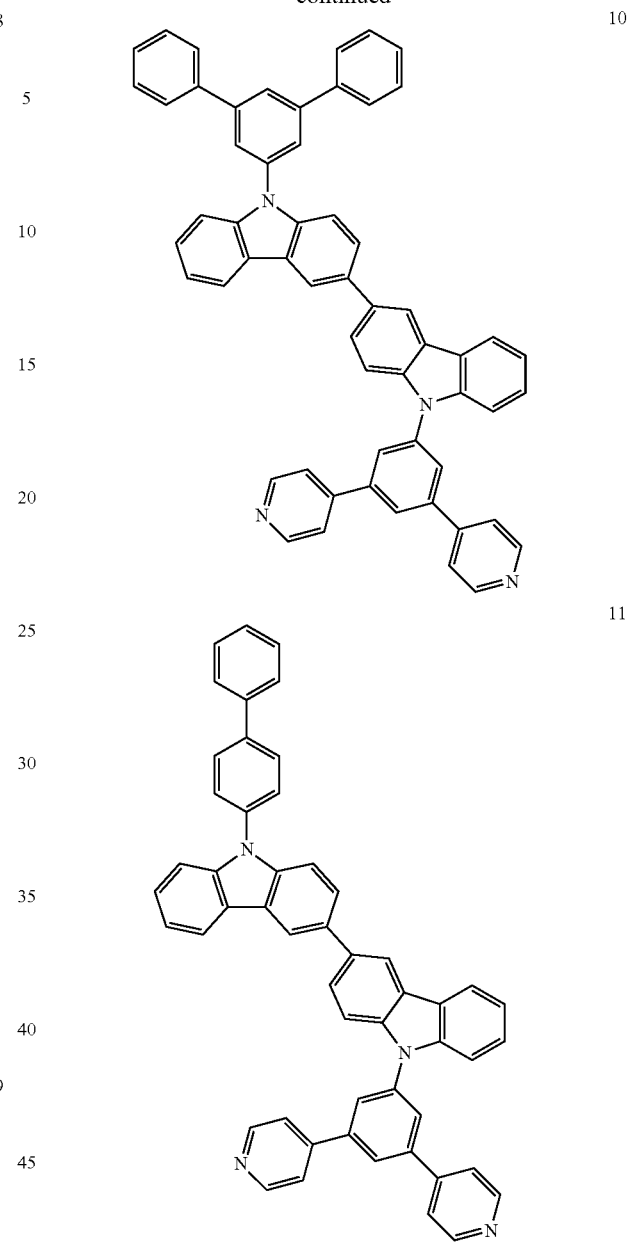

In an implementation, the buffer layer 128 may contain at least one from among a condensed carbonized hydrogen compound (A), an electron-releasing dopant (B), and an organic metal complex (C) containing an alkali metal.

In the above selective example, the electron-releasing dopant (B) may be at least one compound selected from the group of alkali metals, alkali earth metals, rare earth metals, and alkali metal compounds. In an implementation, the alkali metal compound may be at least one selected from the group of oxides of alkali metal, halogenides containing alkali metals, oxides of alkali earth metals, halogenides of alkali earth metals, oxides of rare earth metals, and halogenides of rare earth metals.

In an implementation, the condensed carbonized hydrogen compound (A) may be expressed as one from among Formulae 1 through 4 below. $Ar^1$ through $Ar^5$ indicate condensed ring structures in which the numbers of ring-forming carbons that can have substituents are from 4 to 16.

(1)

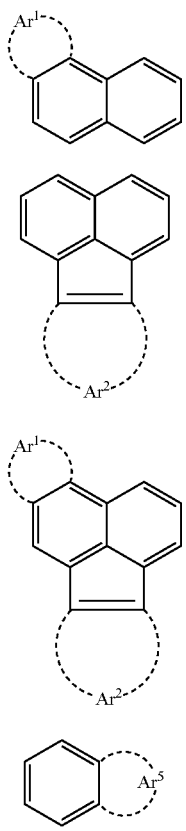

(2)

(3)

(4)

In the above selective example, the organic metal complex (c) containing an alkali metal may be a compound expressed as one from among Formulae 10 through 12 below.

(In Formulae 10 through 12, M denotes alkali metal atom.)

(10)

(11)

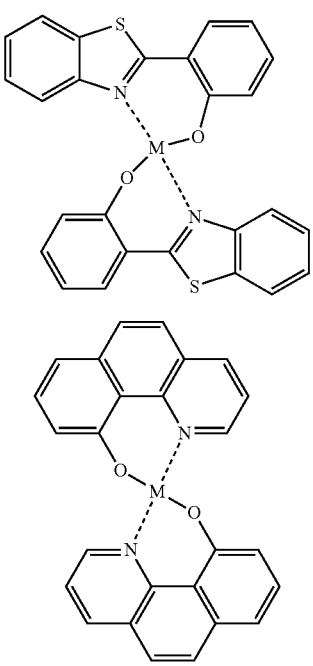

-continued (12)

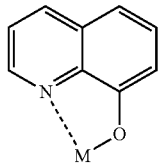

The buffer layer 128 may block conductive particles from spreading from the second electrode 130 (which is formed of a conductive material) to the organic emission layer 122. Furthermore, the buffer layer 128 may help improve electron injection characteristics from the second electrode 130 to the organic emission layer 122, thereby improving light-emission efficiency of the organic emission layer 122.

For example, the buffer layer 128 may be arranged to be close to the organic emission layer 122. In this case, the above-stated effect may be further improved.

Figure 3:
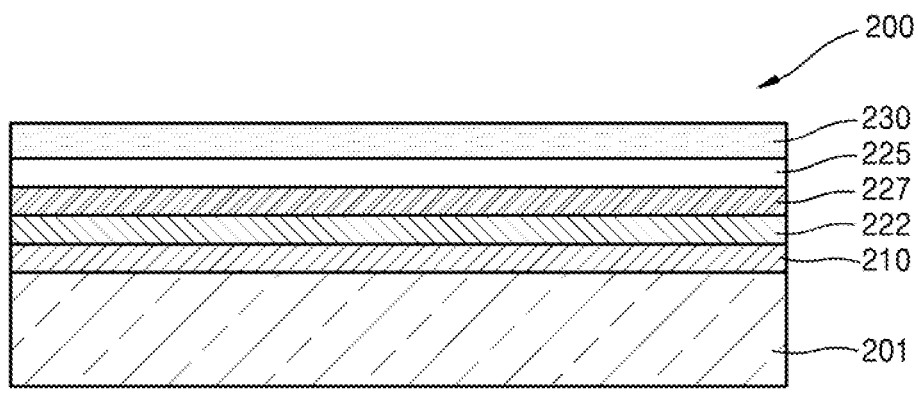
FIG. 3 illustrates a schematic sectional view of an organic light-emitting display apparatus according to another embodiment.

FIG. 3 illustrates a schematic sectional view of an organic light-emitting display apparatus 200 according to another embodiment. Referring to FIG. 3, the organic light-emitting display apparatus 200 according to the present embodiment may include a first electrode 210, a second electrode 230, an organic emission layer 222, a barrier layer 225, and a metal layer 227 that are formed on a substrate 201.

For convenience of explanation, descriptions below will focus on differences between the previous embodiment and the present embodiment.

The first electrode 210 and the second electrode 230 may be formed on the substrate 201. Materials for forming the substrate 201 are identical to those according to the previous embodiment, and thus repeated detailed descriptions thereof may be omitted.

The organic emission layer 222 may be between the first electrode 210 and the second electrode 230. Although not shown, locations of the first electrode 210 and the second electrode 230 may be reversed. For example, the first electrode 210 may be arranged above the second electrode 230. If the first electrode 210 is arranged above the second electrode 230, the order in which members therebetween are stacked may also be changed.

The first electrode 210 may function as an anode. Materials for forming the first electrode 210 may be identical to those according to the previous embodiment, and repeated detailed descriptions thereof may be omitted.

The organic emission layer 222 may be between the first electrode 210 and the second electrode 230.

The second electrode 230 may contain AgMg. For example, the second electrode 230 may contain Ag (silver) and Mg (magnesium). In an implementation, the second electrode 230 may contain Ag as the main component and may contain Mg as the sub component. For example, the second electrode 230 may contain more Ag than Mg, based on weight percentage (wt %).

The barrier layer 225 may contain a barrier material, e.g., LiF. The barrier layer 225 may block migration of metals of the second electrode 230, e.g., Ag. The barrier layer 225 may primarily block migration of Ag of the second electrode 230 to the organic emission layer 222, and may secondarily block migration of Ag of the second electrode 230 to the first electrode 210. For example, in the present embodiment, the barrier layer 225 may contact the second electrode 230, and the barrier layer 225 may block metals of the second electrode 230 from migrating to the metal layer 227 that is past the barrier layer 225.

The barrier layer 225 may contain various other materials. For example, LiF contained in the barrier layer 225 as stated above is merely an example, and the barrier layer 225 may contain various fluorides. In an implementation, the barrier layer 225 may contain at least one from a group of LiF, $CaF_2$, $NaF_2$ and $AlF_3$.

In an implementation, the barrier layer 225 may contain an oxide. For example, the barrier layer 225 may contain at least one from selected from the group of CaO, LiO, MgO, ZnO, and ITO.

In an implementation, the barrier layer 225 may contain a halogen-containing compound. For example, the barrier layer 225 may contain RbBr, RbI, or RbCl.

The metal layer 227 may be arranged between the second electrode 230 and the organic emission layer 222. For example, the metal layer 227 may be arranged between the barrier layer 225 and the organic emission layer 222.

The metal layer 227 may contain at least one selected from the group of Yb (ytterbium), Sm (samarium), Ca (calcium), Sr (strontium), Eu (europium), Tb (terbium), Ba (barium), La (lanthanum), and Ce (cesium). The metals contained in the metal layer 227 may be materials having low work functions, and electron injection characteristics from the second electrode 230 to the organic emission layer 222 may be improved. For example, the second electrode 230 may be mainly formed of Ag, and a difference between work functions for electron injection to the organic emission layer 222 via the second electrode 230 may be significant. However, work functions of the materials included in the metal layer 227 may not be significantly different from that of Ag, which may be the main content of the second electrode 230, and electrons may flow smoothly from the second electrode 230 toward the metal layer 227. For example, according to the present embodiment, the metal layer 227 may contact the second electrode 230 to help improve characteristics of a flow of electrons from the second electrode 230 toward the metal layer 227 and a flow of electrons from the metal layer 227 toward the organic emission layer 222.

The metal layer 227 may be formed using any of various methods, e.g., a deposition.

The organic light-emitting display apparatus 200 according to the present embodiment includes the metal layer 227 between the second electrode 230 and the 222, thereby improving electron injection characteristics from the second electrode 230 to the organic emission layer 222. Therefore, the organic light-emitting display apparatus 200 with high efficiency may be easily embodied.

According to the present embodiment, the barrier layer 225 may contain various oxides, fluorides, or halogen-containing compounds, and the barrier layer 225 may be arranged between the second electrode 230 and the organic emission layer 222. The second electrode 230 may help prevent migration of metals by using the barrier layer 225, thereby suppressing a short circuit failure between the first electrode 210 and the second electrode 230 and abnormal light emission of the organic emission layer 222.

For example, the barrier layer 225 may contact the second electrode 230 and may help improve barrier characteristics of the second electrode 230 against metals.

As a result, optical and electric characteristics of the organic light-emitting display apparatus 200 may be improved.

Figure 4:
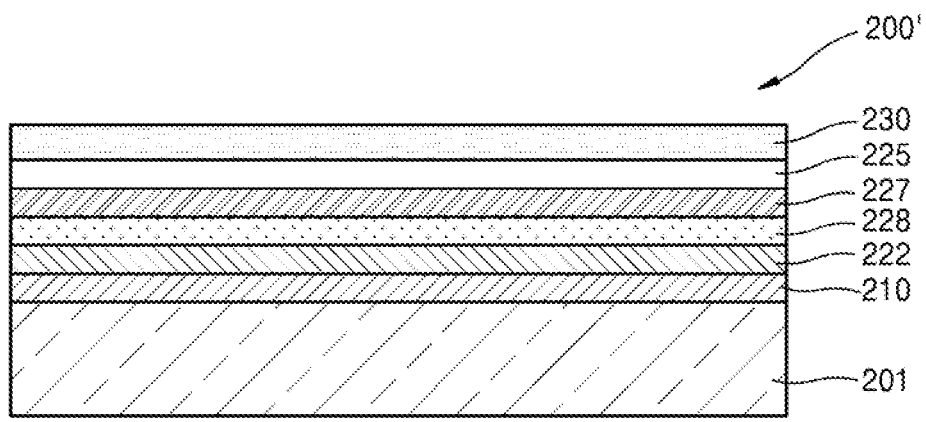
FIG. 4 illustrates a schematic sectional diagram showing a modified example of the organic light-emitting display apparatus shown in FIG. 3.

FIG. 4 illustrates a schematic sectional diagram showing a modified example of the organic light-emitting display apparatus 200 shown in FIG. 3.

For convenience of explanation, descriptions given below will focus on differences between the embodiment shown in FIG. 4 and the embodiment shown in FIG. 3. Like reference numerals denote like elements, and thus repeated detailed descriptions thereof may be omitted.

Referring to FIG. 4, compared to the organic light-emitting display apparatus 200 of FIG. 3, an organic light-emitting display apparatus 200' may further include a buffer layer 228.

The buffer layer 228 may be arranged between the second electrode 230 and the organic emission layer 222. In an implementation, the buffer layer 228 may be arranged to be closer to the organic emission layer 222 than the barrier layer 225 and the metal layer 227 are to the organic emission layer. For example, the buffer layer 228 may be between the organic emission layer 222 and the barrier layer 225.

The buffer layer 228 may contain various materials. For example, the buffer layer 228 may contain a fluoride. In an implementation, the buffer layer 228 may contain at least one selected from the group of LiF, $CaF_2$, $NaF_2$ and $AlF_3$.

In an implementation, the buffer layer 228 may contain an oxide. For example, the buffer layer 228 may contain at least one selected from the group of CaO, LiO, MgO, ZnO, and ITO.

In an implementation, the buffer layer 228 may contain a chloride. For example, the buffer layer 228 may contain RbCl.

In an implementation, the buffer layer 228 may contain an organic material. The organic materials may be identical to those in the previous embodiments.

The buffer layer 228 may block conductive particles from spreading from the second electrode 230 (which is formed of a conductive material) to the organic emission layer 222. Furthermore, the buffer layer 228 may help improve electron injection characteristics from the second electrode 230 to the organic emission layer 222, thereby improving light-emission efficiency of the organic emission layer 222.

Figure 5:
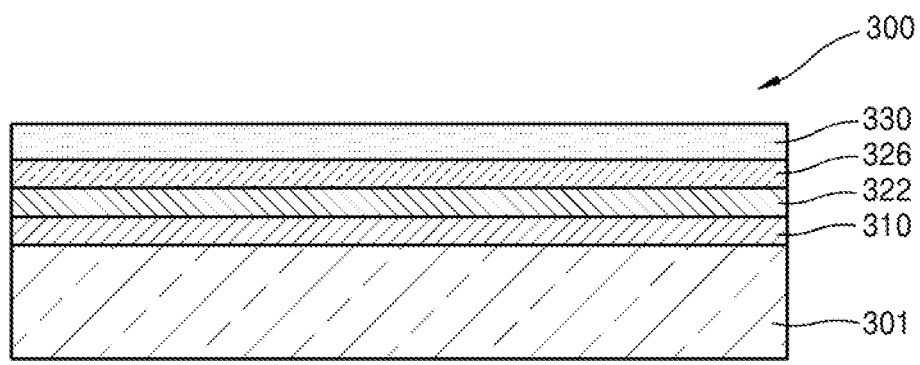
FIG. 5 illustrates a schematic sectional view of an organic light-emitting display apparatus according to another embodiment.

FIG. 5 illustrates a schematic sectional view of an organic light-emitting display apparatus 300 according to another embodiment.

Referring to FIG. 5, the organic light-emitting display apparatus 300 according to the present embodiment may include a first electrode 310, a second electrode 330, an organic emission layer 322, and a mixed layer 326, that are formed on a substrate 301.

For convenience of explanation, descriptions below will focus on differences between the previous embodiments and the present embodiment.

The first electrode 310 and the second electrode 330 may be formed on the substrate 301. Materials for forming the substrate 301 may be identical to those according to the previous embodiments, and thus repeated detailed descriptions thereof may be omitted.

The organic emission layer 322 may be between the first electrode 310 and the second electrode 330. Although not shown, locations of the first electrode 310 and the second electrode 330 may be reversed. For example, the first electrode 310 may be arranged above the second electrode 330. If the first electrode 310 is arranged above the second electrode 330, the order in which members therebetween are stacked is also changed.

The first electrode 310 may function as an anode. Materials for forming the first electrode 310 may be identical to those according to the previous embodiments, and repeated detailed descriptions thereof may be omitted.

The organic emission layer 322 may be arranged between the first electrode 310 and the second electrode 330.

The second electrode 330 may contain AgMg. For example, the second electrode 330 may contain Ag (silver) and Mg (magnesium). In an implementation, the second electrode 330 may contain Ag as the main component and may contain Mg as the sub or minor component. For example, the second electrode 330 may a greater amount of Ag than amount of Mg, based on weight percentage (wt %).

The mixed layer 326 may contain a barrier material and a metal. The barrier material may contain LiF. The barrier material in the mixed layer 326 may include various materials. For example, LiF contained in the barrier material as stated above is merely an example, and the barrier material may contain various fluorides. In an implementation, the barrier material may contain at least one from a group of LiF, $CaF_2$, $NaF_2$ and $AlF_3$.

In an implementation, the barrier material may contain an oxide. For example, the barrier material may contain at least one from selected from the group of CaO, LiO, MgO, ZnO, and ITO.

In an implementation, the barrier material may contain a halogen-containing compound. For example, the barrier material may contain RbBr, RbI, or RbCl.

The metal may include at least one selected from among a group of Yb (ytterbium), Sm (samarium), Ca (calcium), Sr (strontium), Eu (europium), Tb (terbium), Ba (barium), La (lanthanum), and Ce (cesium).

The mixed layer 326 may include a barrier material and may block migration of metals of the second electrode 330, e.g., Ag. For example, the barrier material of the mixed layer 326 may primarily block migration of Ag of the second electrode 330 to the organic emission layer 322, and may secondarily block migration of Ag of the second electrode 330 to the first electrode 310.

The mixed layer 326 may include at least one selected from among a group of Yb (ytterbium), Sm (samarium), Ca (calcium), Sr (strontium), Eu (europium), Tb (terbium), Ba (barium), La (lanthanum), and Ce (cesium). The metals contained in the metal layer 327 may be materials having low work functions, thereby improving electron injection characteristics from the second electrode 330 to the organic emission layer 322

The organic light-emitting display apparatus 300 according to the present embodiment may include the mixed layer 326, and the mixed layer 326 contains a barrier material containing an oxide, a fluoride, or a halogen-containing compound and a metal selected from among a group of Yb (ytterbium), Sm (samarium), Ca (calcium), Sr (strontium), Eu (europium), Tb (terbium), Ba (barium), La (lanthanum), and Ce (cesium).

Both a barrier material and a metal may be included in a single layer of the mixed layer 326, a thickness of the organic light-emitting display apparatus 300 may be maintained, migration of a metal of the second electrode 330 may be prevented, and electron injection characteristics from the second electrode 330 to the organic emission layer 322 may be improved.

Figure 6:
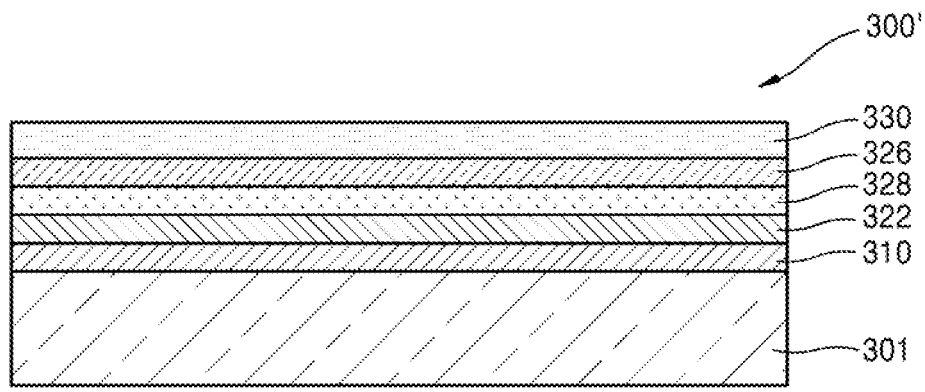
FIG. 6 illustrates a schematic sectional diagram showing a modified example of the organic light-emitting display apparatus shown in FIG. 5.

For example, the mixed layer 326 may contain a greater amount of barrier material than an amount of metal, based on weight percentage (wt %). For example, the mixed layer 326 may contain a barrier material and a metal at a weight ratio of 7:3, based on weight percentage (wt %). The mixed layer 326 may be formed as a single layer, and the mixed layer 326 may contain more barrier material than a metal to retain barrier characteristic. FIG. 6 illustrates a schematic sectional diagram showing a modified example of the organic light-emitting display apparatus 300 shown in FIG. 5.

For convenience of explanation, descriptions given below will focus on differences between the embodiment shown in FIG. 6 and the embodiment shown in FIG. 5. Like reference numerals denote like elements, and thus repeated detailed descriptions thereof may be omitted.

Referring to FIG. 6, compared to the organic light-emitting display apparatus 300 of FIG. 5, an organic light-emitting display apparatus 300' may further a buffer layer 328.

The buffer layer 328 may be arranged between the second electrode 330 and the organic emission layer 322. In an implementation, the buffer layer 328 may be arranged to be closer to the organic emission layer 322 than the mixed layer 326 is to the organic emission layer 322. For example, the buffer layer 328 may be between the organic emission layer 322 and the mixed layer 326.

The buffer layer 328 may contain various materials, such as fluorides, oxides, chlorides, or organic materials. The materials may be identical to those in the previous embodiments, and repeated detailed descriptions thereof may be omitted.

The buffer layer 328 may block conductive particles from being spread from the second electrode 330 (which is formed of a conductive material) to the organic emission layer 322. In an implementation, the buffer layer 328 may help improve electron injection characteristics from the second electrode 330 to the organic emission layer 322, thereby improving light-emission efficiency of the organic emission layer 322.

In an implementation, the buffer layer 328 may be arranged to be close to the organic emission layer 322. In this case, the above-stated effect may be further improved.

Figure 7:
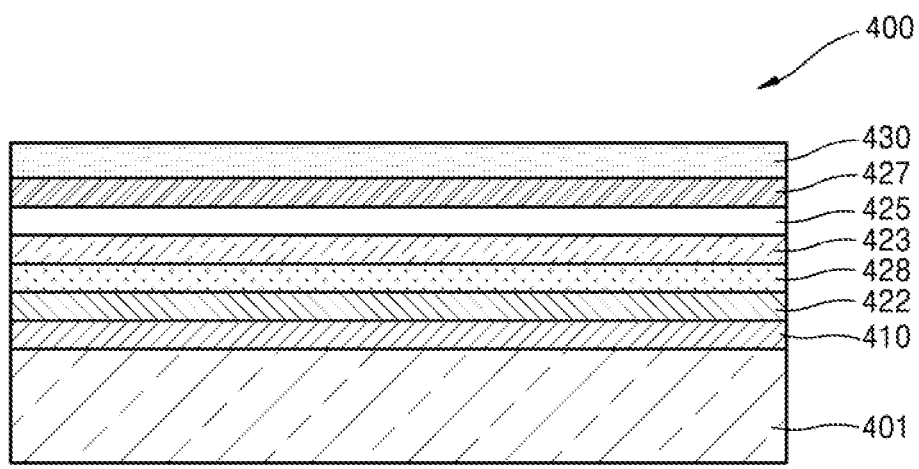
FIG. 7 illustrates a schematic sectional view of an organic light-emitting display apparatus according to another embodiment.

FIG. 7 illustrates a schematic sectional view of an organic light-emitting display apparatus 400 according to another embodiment.

Referring to FIG. 7, the organic light-emitting display apparatus 400 according to the present embodiment may include a first electrode 410, a second electrode 430, an organic emission layer 422, a barrier layer 425, a metal layer 427, and an electron transport layer 423, that are formed on a substrate 401.

For convenience of explanation, descriptions below will focus on differences between the previous embodiment and the present embodiments.

Materials for forming the substrate 401 may be identical to those according to the previous embodiment, and thus repeated detailed descriptions thereof may be omitted.

The first electrode 410 and the second electrode 430 may be formed on the substrate 401. The organic emission layer 422 may be between the first electrode 410 and the second electrode 430. Although not shown, locations of the first electrode 410 and the second electrode 430 may be reversed. In an implementation, the first electrode 410 may be arranged above the second electrode 430. If the first electrode 410 is arranged above the second electrode 430, the order in which members therebetween are stacked is also changed.

The first electrode 410 may function as an anode. Materials for forming the first electrode 410 may be identical to those according to the previous embodiments, and detailed descriptions thereof may be omitted.

The organic emission layer 422 may be arranged between the first electrode 410 and the second electrode 430.

The second electrode 430 may contain AgMg. For example, the second electrode 430 may contain Ag (silver) and Mg (magnesium). In an implementation, the second electrode 430 may contain Ag as the main or major component and may contain Mg as the sub or minor component. For example, the second electrode 430 may contain a greater amount of Ag than an amount of Mg, based on weight percentage (wt %).

The metal layer 427 may be between the second electrode 430 and the organic emission layer 422. The metal layer 427 may contain at least one selected from the group of Yb (ytterbium), Sm (samarium), Ca (calcium), Sr (strontium), Eu (europium), Tb (terbium), Ba (barium), La (lanthanum), and Ce (cesium).

The barrier layer 425 may be between the second electrode 430 and the organic emission layer 422. For example, the barrier layer 425 may be between the metal layer 427 and the organic emission layer 422. The barrier layer 425 may contain a barrier material, e.g., a fluoride, an oxide, or a chloride. The barrier materials may be identical to those in the previous embodiments, and detailed descriptions thereof may be omitted.

The electron transport layer 423 may be arranged between the organic emission layer 422 and the barrier layer 425. Electrons injected via the electron transport layer 423 from the second electrode 430 via the metal layer 427 may be more effectively transported toward the organic emission layer 422.

In an implementation, a buffer layer 428 may be arranged between the second electrode 430 and the organic emission layer 422. In an implementation, the buffer layer 428 may be arranged to be closer to the organic emission layer 422 than the barrier layer 425 and the metal layer 427 are to the organic emission layer 422. For example, the buffer layer 428 may be arranged between the organic emission layer 422 and the barrier layer 425. For example, the buffer layer 428 may be arranged between the electron transport layer 423 and the organic emission layer 422.

The buffer layer 428 may contain various materials, such as fluorides, oxides, chlorides, or organic materials. The materials may be identical to those in the previous embodiments, and repeated detailed descriptions thereof may be omitted.

The buffer layer 428 may block conductive particles from spreading from the second electrode 430 (which is formed of a conductive material) to the organic emission layer 422. Furthermore, the buffer layer 428 may help improve electron injection characteristics from the second electrode 430 to the organic emission layer 422, thereby improving light-emission efficiency of the organic emission layer 422.

In an implementation, the buffer layer 428 may be arranged to be close to (e.g., may directly contact) the organic emission layer 422. In this case, the above-stated effect may be further improved.

Furthermore, the buffer layer 428 may be arranged between the electron transport layer 423 and the organic emission layer 422, thereby improving smoothness of electron transportation from the electron transport layer 423 to the organic emission layer 422.

In an implementation, the buffer layer 428 may be omitted from the structure shown in FIG. 7.

Figure 8:
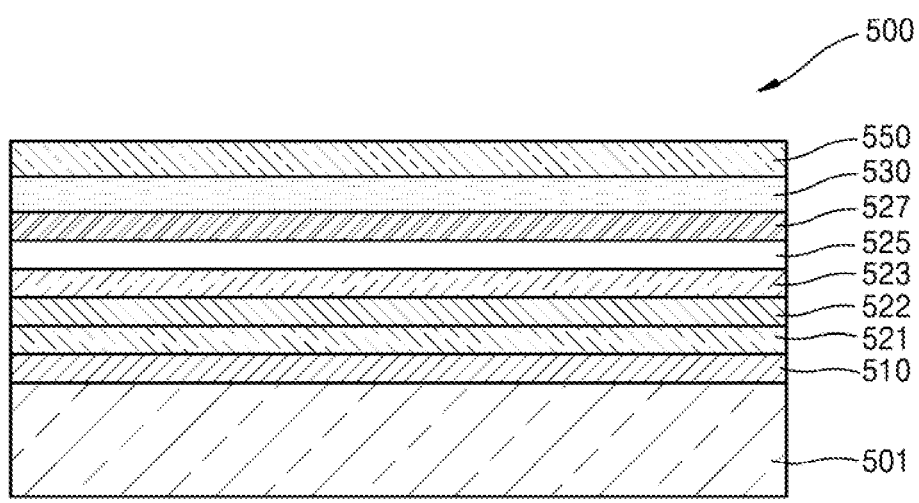
FIG. 8 illustrates a schematic sectional view of an organic light-emitting display apparatus according to another embodiment.

FIG. 8 illustrates a schematic sectional view of an organic light-emitting display apparatus 500 according to another embodiment.

Referring to FIG. 8, the organic light-emitting display apparatus 500 according to the present embodiment may include a first electrode 510, a second electrode 530, an organic emission layer 522, a barrier layer 525, a metal layer 527, a hole injection layer 521, an electron transport layer 523, and a capping layer 550, that are formed on a substrate 501.

For convenience of explanation, descriptions below will focus on differences between the previous embodiments and the present embodiment.

Materials for forming the substrate 501 may be identical to those according to the previous embodiments, and thus repeated detailed descriptions thereof may be omitted.

The first electrode 510 and the second electrode 530 may be formed on the substrate 501.

The organic emission layer 522 may be between the first electrode 510 and the second electrode 530. Although not shown, locations of the first electrode 510 and the second electrode 530 may be reversed. For example, the first electrode 510 may be arranged above the second electrode 530. If the first electrode 510 is arranged above the second electrode 530, the order in which members therebetween are stacked is also changed.

The first electrode 510 may function as an anode. Materials for forming the first electrode 510 may be identical to those according to the previous embodiments, and repeated detailed descriptions thereof may be omitted.

The organic emission layer 522 may be arranged between the first electrode 510 and the second electrode 530.

The second electrode 530 may contain AgMg. For example, the second electrode 530 may contain Ag (silver) and Mg (magnesium). In an implementation, the second electrode 530 may contain Ag as the main or major component, and may contain Mg as the sub or minor component. For example, the second electrode 530 may contain a greater amount Ag than an amount of Mg, based on weight percentage (wt %).

The metal layer 527 may be arranged between the second electrode 530 and the organic emission layer 522. The metal layer 527 may contain at least one selected from the group of Yb (ytterbium), Sm (samarium), Ca (calcium), Sr (strontium), Eu (europium), Tb (terbium), Ba (barium), La (lanthanum), and Ce (cesium).

The barrier layer 525 may be formed between the second electrode 530 and the organic emission layer 522. For example, the barrier layer 525 may be arranged between the metal layer 527 and the organic emission layer 522. The barrier layer 525 may contain a barrier material, e.g., a fluoride, an oxide, or a chloride. The barrier materials may be identical to those in the previous embodiments, and repeated detailed descriptions thereof may be omitted.

The hole injection layer 521 may be arranged between the first electrode 510 and the organic emission layer 522. Although not shown, a hole transport layer may be further arranged between the hole injection layer 521 and the organic emission layer 522. In an implementation, the hole injection layer 521 may also contain a hole transporting material.

The electron transport layer 523 may be arranged between the organic emission layer 522 and the barrier layer 525. Electrons injected via the electron transport layer 523 from the second electrode 530 via the metal layer 527 may be more effectively transported toward the organic emission layer 522.

The capping layer 550 may be formed above the second electrode 530 to help protect the second electrode 530, and may be formed of an organic or inorganic material.

According to an embodiment, the organic light-emitting display apparatus 500 with high efficiency and improved electron injection characteristics from the second electrode 530 to the 540 may be easily embodied by arranging the metal layer 527 containing at least one a group of Yb (ytterbium), Sm (samarium), Ca (calcium), Sr (strontium), Eu (europium), Tb (terbium), Ba (barium), La (lanthanum), and Ce (cesium) between the second electrode 530 and the organic emission layer 522.

For example, the electron transport layer 523 may be arranged between the metal layer 527 and the organic emission layer 522, and electrons may be efficiently transported toward the organic emission layer 522.

Furthermore, the hole injection layer 521 may be formed on the first electrode 510, smoothness of hole transportation via the first electrode 510, and thus light-emission efficiency of the organic emission layer 522 may be improved.

According to the present embodiment, the barrier layer 525 may contain a barrier material, and the barrier layer 525 may be arranged between the second electrode 530 and the organic emission layer 522. Migration of metals of the second electrode 530 may be prevented by using the barrier layer 525, thereby helping to suppress a short circuit failure between the first electrode 510 and the second electrode 530 and abnormal light emission of the organic emission layer 522.

Although not shown in FIG. 8, at least one from among the electron transport layer 523, the hole injection layer 521, and the capping layer 550 may be applied to any of the structures shown in FIGS. 1 through 7.

Figure 9:
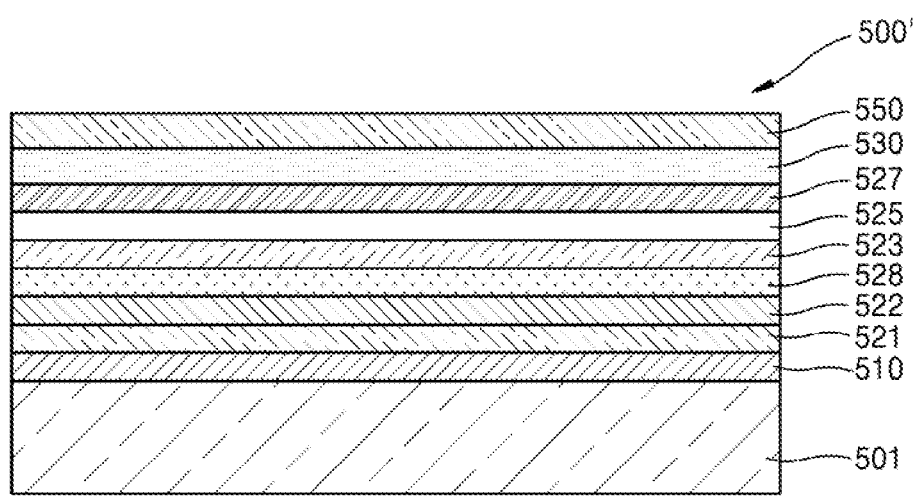
FIG. 9 illustrates a schematic sectional diagram showing a modified example of the organic light-emitting display apparatus shown in FIG. 8.

FIG. 9 illustrates a schematic sectional diagram showing a modified example of the organic light-emitting display apparatus 500 shown in FIG. 8.

For convenience of explanation, descriptions given below will focus on differences between the embodiment shown in FIG. 9 and the embodiment shown in FIG. 8. Like reference numerals denote like elements, and thus repeated detailed descriptions thereof may be omitted.

Referring to FIG. 9, compared to the organic light-emitting display apparatus 500 of FIG. 5, an organic light-emitting display apparatus 500' may further include a buffer layer 528.

The buffer layer 528 may be arranged between the second electrode 530 and the organic emission layer 522. Furthermore, the buffer layer 528 is arranged to be closer to the organic emission layer 522 than the barrier layer 525 and the metal layer 527 are to the organic emission layer 522. For example, the buffer layer 528 may be arranged between the organic emission layer 522 and the barrier layer 525. In an implementation, the buffer layer 528 may be arranged between the electron transport layer 523 and the organic emission layer 522.

The buffer layer 528 may contain various materials, such as fluorides, oxides, chlorides, or organic materials. The materials may be identical to those in the previous embodiments, and repeated detailed descriptions thereof may be omitted.

The buffer layer 528 may block conductive particles from spreading from the second electrode 530 (which is formed of a conductive material) to the organic emission layer 522. Furthermore, the buffer layer 528 may help improve electron injection characteristics from the second electrode 530 to the organic emission layer 522, thereby improving light-emission efficiency of the organic emission layer 522.

For example, the buffer layer 328 may be arranged to be close to (e.g., may directly contact) the organic emission layer 322. In this case, the above-stated effect may be further improved.

Furthermore, the buffer layer 528 may be arranged between the electron transport layer 523 and the organic emission layer 522, thereby improving smoothness of electron transportation from the electron transport layer 523 to the organic emission layer 522.

Figure 10:
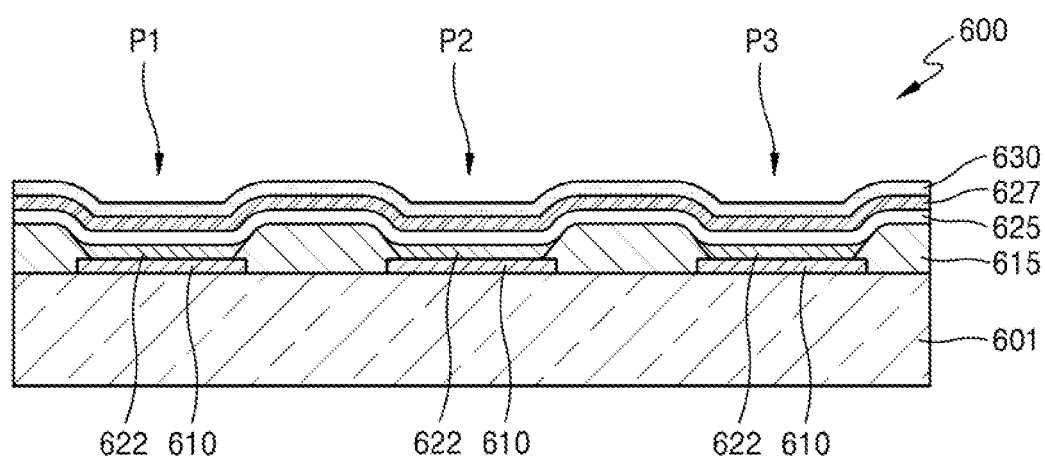
FIG. 10 illustrates a schematic sectional view of an organic light-emitting display apparatus according to another embodiment.

FIG. 10 illustrates a schematic sectional view of an organic light-emitting display apparatus 600 according to an embodiment.

Referring to FIG. 10, the organic light-emitting display apparatus 600 according to the present embodiment may include a first electrode 610, a pixel defining layer 615, a second electrode 630, an organic emission layer 622, a barrier layer 625, and a metal layer 627, that are formed on a substrate 601.

The organic light-emitting display apparatus 600 may include a plurality of pixels P1, P2, and P3. Here, each of the P1, P2, and P3 may be a sub-pixel.

For convenience of explanation, descriptions below will focus on differences between the previous embodiments and the present embodiment.

Materials for forming the substrate 501 may be identical to those according to the previous embodiments, and thus repeated detailed descriptions thereof may be omitted.

The first electrode 610 and the second electrode 630 may be formed on the substrate 601. The pixel defining layer 615 may be formed on the first electrode 610 to expose a designated region of the first electrode 610.

A region at which a region of the first electrode 610 not covered and exposed by the pixel defining layer 615 and the second electrode 630 overlap each other is a region corresponding to the plurality of pixels P1, P2, and P3.

The organic emission layer 622 may be formed between the first electrode 610 and the second electrode 630. For example, the organic emission layer 622 may be formed at the region at which the first electrode 610 and the second electrode 630 overlap each other.

The first electrode 610 may function as an anode. Materials for forming the first electrode 610 may be identical to those according to the previous embodiments, and repeated detailed descriptions thereof may be omitted.

The organic emission layer 622 may be arranged between the first electrode 610 and the second electrode 630. For example, the organic emission layer 622 may correspond to or overlie the exposed region of the first electrode 610.

The second electrode 630 may include AgMg. For example, the second electrode 630 may contain Ag (silver) and Mg (magnesium). In an implementation, the second electrode 630 may contain Ag as the main or major component and may contain Mg as the sub or minor component. For example, the second electrode 630 may contain a greater amount of Ag than an amount of Mg, based on weight percentage (wt %).

The metal layer 627 may be arranged between the second electrode 630 and the organic emission layer 622. The metal layer 627 may contain at least one selected from the group of Yb (ytterbium), Sm (samarium), Ca (calcium), Sr (strontium), Eu (europium), Tb (terbium), Ba (barium), La (lanthanum), and Ce (cesium).

In an implementation, the metal layer 627 may have a long shape, e.g., to continuously correspond to or overlie all of the pixels P1, P2, and P3, e.g., to be common at all of the pixels P1, P2, and P3. In an implementation, the metal layer 627 may be separated to discontinuously correspond to or overlie pixels P1, P2, and P3, respectively.

The barrier layer 625 may be formed between the second electrode 630 and the organic emission layer 622. For example, the barrier layer 625 may be arranged between the metal layer 627 and the organic emission layer 622.

The barrier layer 625 may contain various materials. For example, the barrier layer 625 may contain at least one from a group of LiF, $CaF_2$, $NaF_2$ and $AlF_3$.

In an implementation, the barrier layer 625 may contain an oxide. For example, the barrier layer 625 may contain at least one from selected from the group of CaO, LiO, MgO, ZnO, and ITO.

In an implementation, the barrier layer 625 may contain a halogen-containing compound. For example, the barrier layer 625 may contain RbBr, RbI, or RbCl.

In an implementation, the barrier layer 625 may have a long shape to continuously correspond to or overlie all of the pixels P1, P2, and P3, e.g., to be common at all of the pixels P1, P2, and P3. In an implementation, the barrier layer 625 may be separated to discontinuously correspond to or overlie pixels P1, P2, and P3, respectively.

Although not shown in FIG. 10, any of the structures as shown in FIGS. 1 through 9 may be applied as-is to or may be modified and applied to the organic light-emitting display apparatus 600 of FIG. 10. For example, the organic light-emitting display apparatus 600 of FIG. 10 may further include a buffer layer (not shown) or may further include an electron transport layer. Furthermore, the organic light-emitting display apparatus 600 of FIG. 10 may further include a mixed layer instead of a barrier layer and a metal layer. Furthermore, locations of the barrier layer 625 and the metal layer 627 may be reversed.

Figure 11:
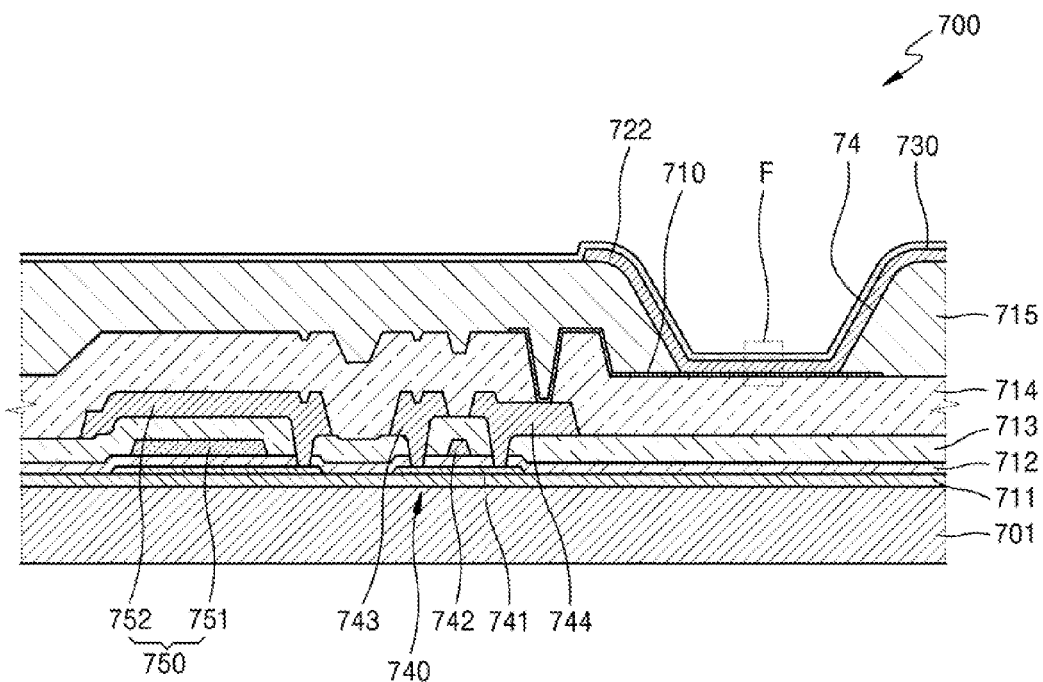
FIG. 11 illustrates a schematic sectional view of an organic light-emitting display apparatus according to another embodiment.
Figure 12:
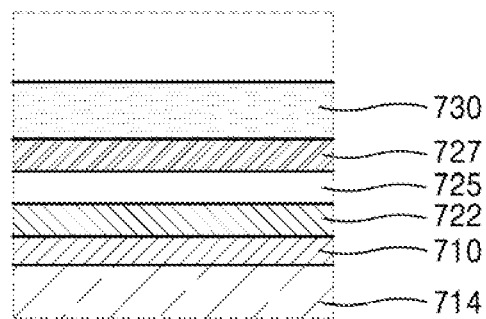
FIG. 12 illustrates an enlarged diagram showing F of FIG. 11 in closer detail.

FIG. 11 illustrates a schematic sectional view of an organic light-emitting display apparatus 600 according to an embodiment, and FIG. 12 illustrates a diagram showing F of FIG. 11 in closer detail.

The organic light-emitting display apparatus 700 may include a first electrode 710, a second electrode 730, an organic emission layer 722, a barrier layer 725, a metal layer 727, a thin-film transistor (TFT) 740, and a capacitor 750.

The organic light-emitting display apparatus 700 according to the present embodiment may include a plurality of pixels (or sub-pixels) like the organic light-emitting display apparatus 600 of FIG. 10. However, for convenience of explanation, only one pixel (or sub-pixel) is shown.

A base buffer layer 711, which provides a flat surface on a substrate 701 and contains an insulator for preventing permeation of moisture or impurities toward the substrate 701, may be formed on the substrate 701.

The TFT 740 and the capacitor 750 may be formed on the base buffer layer 711.

The TFT 740 may include an active layer 741, a gate electrode 742, a source electrode 743, and a drain electrode 744.

The capacitor 750 may include a first capacitor electrode 751 and a second capacitor electrode 752.

For example, the active layer 741 (formed to have a designated pattern) may be arranged on the top surface of the base buffer layer 711.

The active layer 741 may contain an inorganic semiconductor material, e.g., silicon, an organic semiconductor material, or an oxide semiconductor material. The first capacitor electrode 751 may be formed on a same layer as the active layer 741 and may be formed of a same material as the active layer 741.

A gate insulation layer 712 may be formed on the active layer 741. The gate electrode 742 may be formed on the gate insulation layer 712 in correspondence to the active layer 741. An interlayer insulation layer 713 may cover the gate electrode 742, and the source electrode 743 and the drain electrode 744 may be formed on the interlayer insulation layer 713 to contact designated regions of the active layer 741.

The second capacitor electrode 752 may be formed on a same layer as the source electrode 743 and the drain electrode 744 and may be formed of a same material as the source electrode 743 and the drain electrode 744.

A passivation layer 714 may cover the source electrode 743 and the drain electrode 744, and an additional insulation layer may be formed on the passivation layer 714 to planarize the TFT 740.

The first electrode 710 may be formed on the passivation layer 714. The first electrode 710 may be electrically connected to either the source electrode 743 or the drain electrode 744. Furthermore, a pixel defining layer 715 may cover the first electrode 710. A designated opening 74 may be formed in the pixel defining layer 715, and the organic emission layer 722 may be formed in a region defined by the opening 74. The second electrode 730 may be formed on the organic emission layer 722.

The second electrode 730 may contain AgMg. For example, the second electrode 730 may contain Ag (silver) and Mg (magnesium). In an implementation, the second electrode 730 may contain Ag as the main or major component, and may contain Mg as the sub or minor component. For example, the second electrode 730 may contain a greater amount of Ag than an amount of Mg, based on weight percentage (wt %).

The metal layer 727 may be arranged between the second electrode 730 and the organic emission layer 722. The metal layer 727 may contain at least one selected from the group of Yb (ytterbium), Sm (samarium), Ca (calcium), Sr (strontium), Eu (europium), Tb (terbium), Ba (barium), La (lanthanum), and Ce (cesium).

The barrier layer 725 may be formed between the second electrode 730 and the organic emission layer 722. For example, the barrier layer 725 may be arranged between the metal layer 727 and the organic emission layer 722.

The barrier layer 725 may contain various materials. For example, the barrier layer 725 may contain at least one from a group of LiF, $CaF_2$, $NaF_2$ and $AlF_3$.

In an implementation, the barrier layer 725 may contain an oxide. For example, the barrier layer 725 may contain at least one from selected from the group of CaO, LiO, MgO, ZnO, and ITO.

In an implementation, the barrier layer 725 may contain a halogen compound. For example, the barrier layer 725 may contain RbBr, RbI, or RbCl.

Although FIGS. 11 and 12 show structures similar to the structure shown in FIG. 1, the present embodiment is not limited thereto. For example, any of the structures shown in FIGS. 1-12 may be applied as-is to or may be modified and applied to the organic light-emitting display apparatus 700 of FIGS. 11 and 12. For example, the organic light-emitting display apparatus 700 of FIG. 11 may further include a buffer layer (not shown) or may further include an electron transport layer. Furthermore, the organic light-emitting display apparatus 700 of FIG. 11 may further include a mixed layer instead of a barrier layer and a metal layer. Furthermore, locations of the barrier layer 725 and the metal layer 727 may be reversed.

Furthermore, the organic light-emitting display apparatus 700 of FIG. 11 may have the structure shown in FIG. 1. For example, the metal layer 727 or the barrier layer 725 may be continuously formed to be common at all pixels or may be discontinuously formed for each separate pixel.

Figure 13:
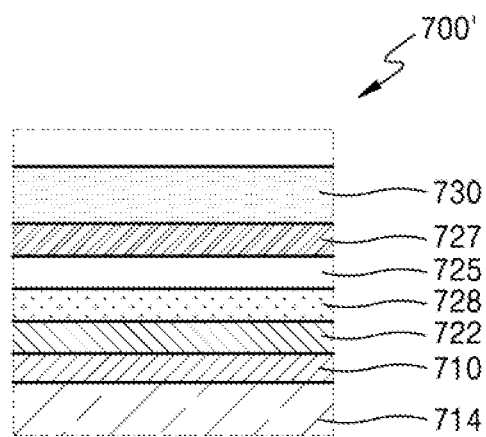
FIG. 13 illustrates a schematic sectional diagram showing a modified example of the organic light-emitting display apparatus shown in FIG. 12.

FIG. 13 illustrates a schematic sectional diagram showing a modified example of the organic light-emitting display apparatus 700 shown in FIG. 12. Like reference numerals denote like elements, and thus repeated detailed descriptions thereof may be omitted.

For convenience of explanation, descriptions given below will focus on differences between the embodiment shown in FIG. 13 and the embodiment shown in FIGS. 11 and 12.

Referring to FIG. 13, compared to the organic light-emitting display apparatus 700 of FIGS. 11 and 12, an organic light-emitting display apparatus 700' may further include a buffer layer 728.

The buffer layer 728 may be arranged between the second electrode 730 and the organic emission layer 722. In an implementation, the buffer layer 728 may be arranged to be closer to the organic emission layer 722 than the barrier layer 725 and the metal layer 727 are to the organic emission layer 722. For example, the buffer layer 728 may be arranged between the organic emission layer 722 and the barrier layer 725.

The buffer layer 728 may contain various materials. The materials may be identical to those in the previous embodiments, and repeated detailed descriptions thereof may be omitted.

The buffer layer 728 may block conductive particles from spreading from the second electrode 730 (which is formed of a conductive material) to the organic emission layer 722. Furthermore, the buffer layer 728 may help improve electron injection characteristics from the second electrode 730 to the organic emission layer 722, thereby improving light-emission efficiency of the organic emission layer 722.

For example, the buffer layer 728 may be arranged to be close to (e.g., may directly contact) the organic emission layer 722. In this case, the above-stated effect may be further improved.

By way of summation and review, various materials for improving characteristics of a second electrode and improving light-emitting characteristics and durability of the organic light emitting display apparatus have been considered.

An organic light emitting display apparatus according to an embodiment may effectively improve electric characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting display apparatus, comprising:
   a first electrode;
   a second electrode on the first electrode, the second electrode including silver and magnesium;
   an organic emission layer between the first electrode and the second electrode;
   a metal layer between the organic emission layer and the second electrode; and
   a barrier layer between the organic emission layer and the second electrode.

2. The organic light emitting display apparatus as claimed in claim 1, wherein the metal layer includes at least one selected from the group of ytterbium, samarium, calcium, strontium, europium, terbium, barium, lanthanum, and cesium.

3. The organic light emitting display apparatus as claimed in claim 1, wherein the barrier layer includes a fluoride.

4. The organic light emitting display apparatus as claimed in claim 3, wherein the fluoride includes at least one selected from the group of LiF, $CaF_2$, $NaF_2$ and $AlF_3$.

5. The organic light emitting display apparatus as claimed in claim 1, wherein the barrier layer includes an oxide.

6. The organic light emitting display apparatus as claimed in claim 5, wherein the oxide includes at least one selected from the group of CaO, LiO, MgO, ZnO, and ITO.

7. The organic light emitting display apparatus as claimed in claim 1, wherein the barrier layer includes a halogen-containing compound.

8. The organic light emitting display apparatus as claimed in claim 1, wherein a weight percent of silver in the second electrode is greater than a weight percent of magnesium in the second electrode.

9. The organic light emitting display apparatus as claimed in claim 1, wherein the metal layer is closer to the second electrode than the barrier layer is to the second electrode.

10. The organic light emitting display apparatus as claimed in claim 1, wherein the metal layer contacts the second electrode.

11. The organic light emitting display apparatus as claimed in claim 1, wherein the barrier layer is closer to the second electrode than the metal layer is to the second electrode.

12. The organic light emitting display apparatus as claimed in claim 1, further comprising a buffer layer, the buffer layer being between the second electrode and the organic emission layer.

13. The organic light emitting display apparatus as claimed in claim 12, wherein the buffer layer is closer to the organic emission layer than the metal layer and the barrier layer are to the organic emission layer.

14. The organic light emitting display apparatus as claimed in claim 12, wherein the buffer layer includes a fluoride.

15. The organic light emitting display apparatus as claimed in claim 14, wherein the fluoride includes at least one selected from the group of LiF, $CaF_2$, $NaF_2$ and $AlF_3$.

16. The organic light emitting display apparatus as claimed in claim 14, wherein the buffer layer includes an oxide.

17. The organic light emitting display apparatus as claimed in claim 16, wherein the oxide includes at least one selected from the group of CaO, LiO, MgO, ZnO, and ITO.

18. The organic light emitting display apparatus as claimed in claim 12, wherein the buffer layer includes a chloride.

19. The organic light emitting display apparatus as claimed in claim 18, wherein the chloride includes RbCl.

20. The organic light emitting display apparatus as claimed in claim 12, wherein the buffer layer includes an organic material.

21. The organic light emitting display apparatus as claimed in claim 1, further comprising an electron transport layer, the electron transport layer being between the second electrode and the organic emission layer,
   wherein the metal layer and the barrier layer are between the electron transport layer and the second electrode.

22. The organic light emitting display apparatus as claimed in claim 21, further comprising a buffer layer, the buffer layer being between the organic emission layer and the electron transport layer.

23. The organic light emitting display apparatus as claimed in claim 22, wherein the buffer layer includes at least one selected from the group of fluorides, oxides, chlorides, and organic materials.

24. An organic light emitting display apparatus, comprising:
   a first electrode;
   a second electrode on the first electrode, the second electrode including silver and magnesium;
   an organic emission layer between the first electrode and the second electrode; and
   a mixed layer between the organic emission layer and the second electrode, the mixed layer including a metal and a barrier material.

25. The organic light emitting display apparatus as claimed in claim 24, wherein the metal includes at least one selected from the group of ytterbium, samarium, calcium, strontium, europium, terbium, barium, lanthanum, and cesium.

26. The organic light emitting display apparatus as claimed in claim 24, wherein the barrier material includes a fluoride.

27. The organic light emitting display apparatus as claimed in claim 26, wherein the fluoride includes at least one selected from the group of LiF, $CaF_2$, $NaF_2$ and $AlF_3$.

28. The organic light emitting display apparatus as claimed in claim 24, wherein the barrier material includes an oxide.

29. The organic light emitting display apparatus as claimed in claim 28, wherein the oxide includes at least one selected from the group of CaO, LiO, MgO, ZnO, and ITO.

30. The organic light emitting display apparatus as claimed in claim 24, wherein the barrier material includes a halogen-containing compound.

31. The organic light emitting display apparatus as claimed in claim 24, wherein a weight percent of silver in the second electrode is greater than a weight percent of magnesium in the second electrode.

32. The organic light emitting display apparatus as claimed in claim 24, further comprising a buffer layer, the buffer layer being between the organic emission layer and the second electrode.

33. The organic light emitting display apparatus as claimed in claim 32, wherein the buffer layer is closer to the organic emission layer than the mixed layer is to the organic emission layer.

34. The organic light emitting display apparatus as claimed in claim 32, wherein the buffer layer includes a fluoride.

35. The organic light emitting display apparatus as claimed in claim 34, wherein the fluoride includes at least one selected from the group of LiF, $CaF_2$, $NaF_2$ and $AlF_3$.

36. The organic light emitting display apparatus as claimed in claim 32, wherein the buffer layer includes an oxide.

37. The organic light emitting display apparatus as claimed in claim 36, wherein the oxide includes at least one selected from the group of CaO, LiO, MgO, ZnO, and ITO.

38. The organic light emitting display apparatus as claimed in claim 32, wherein the buffer layer includes a chloride.

39. The organic light emitting display apparatus as claimed in claim 38, wherein the chloride includes RbCl.

40. The organic light emitting display apparatus as claimed in claim 32, wherein the buffer layer includes an organic material.

41. The organic light emitting display apparatus as claimed in claim 24, further comprising an electron transport layer, the electron transport layer being between the second electrode and the organic emission layer,
wherein the mixed layer is between the electron transport layer and the second electrode.

42. The organic light emitting display apparatus as claimed in claim 41, further comprising a buffer layer, the buffer layer being between the organic emission layer and the electron transport layer.

43. The organic light emitting display apparatus as claimed in claim 42, wherein the buffer layer includes at least one selected from the group of fluorides, oxides, chlorides, and organic materials.

44. An organic light emitting display apparatus comprising a plurality of pixels, wherein each pixel of the plurality of pixels includes:
a first electrode;
a second electrode on the first electrode, the second electrode including silver and magnesium;
an organic emission layer between the first electrode and the second electrode;
a metal layer between the organic emission layer and the second electrode; and
a barrier layer between the organic emission layer and the second electrode.

45. The organic light emitting display apparatus as claimed in claim 44, wherein the barrier layer or the metal layer is common to two or more pixels.

46. The organic light emitting display apparatus as claimed in claim 44, wherein the barrier layer or the metal layer is formed separately for each of the pixels.

47. The organic light emitting display apparatus as claimed in claim 44, wherein each of the pixels includes a thin-film transistor (TFT) electrically connected to the first electrode.

48. The organic light emitting display apparatus as claimed in claim 44, wherein the metal layer contains at least one selected from the group of ytterbium, samarium, calcium, strontium, europium, terbium, barium, lanthanum, and cesium.

49. The organic light emitting display apparatus as claimed in claim 44, wherein the barrier layer includes a fluoride.

50. The organic light emitting display apparatus as claimed in claim 49, wherein the fluoride includes at least one selected from the group of LiF, $CaF_2$, $NaF_2$ and $AlF_3$.

51. The organic light emitting display apparatus as claimed in claim 44, wherein the barrier layer includes an oxide.

52. The organic light emitting display apparatus as claimed in claim 51, wherein the oxide includes at least one selected from the group of CaO, LiO, MgO, ZnO, and ITO.

53. The organic light emitting display apparatus as claimed in claim 44, wherein the barrier layer includes a halogen-containing compound.

54. The organic light emitting display apparatus as claimed in claim 44, wherein a weight percent of silver in the second electrode is greater than a weight percent of magnesium in the second electrode.

55. The organic light emitting display apparatus as claimed in claim 44, wherein:
the metal layer is closer to the second electrode than the barrier layer is to the second electrode, and
the metal layer contacts the second electrode.

56. The organic light emitting display apparatus as claimed in claim 44, wherein the barrier layer is closer to the second electrode than the metal layer is to the second electrode.

57. The organic light emitting display apparatus as claimed in claim 44, further comprising a buffer layer, the buffer layer being between the second electrode and the organic emission layer.

58. The organic light emitting display apparatus as claimed in claim 57, wherein the buffer layer is closer to the organic emission layer than the metal layer and the barrier layer are to the organic emission layer.

59. The organic light emitting display apparatus as claimed in claim 57, wherein the buffer layer includes a fluoride.

60. The organic light emitting display apparatus as claimed in claim 59, wherein the fluoride includes at least one selected from the group of LiF, $CaF_2$, $NaF_2$ and $AlF_3$.

61. The organic light emitting display apparatus as claimed in claim 57, wherein the buffer layer includes an oxide.

62. The organic light emitting display apparatus as claimed in claim 61, wherein the oxide comprises at least one selected from the group of CaO, LiO, MgO, ZnO, and ITO.

63. The organic light emitting display apparatus as claimed in claim 57, wherein the buffer layer includes a chloride.

64. The organic light emitting display apparatus as claimed in claim 63, wherein the chloride includes RbCl.

65. The organic light emitting display apparatus as claimed in claim 57, wherein the buffer layer includes an organic material.

66. An organic light emitting display apparatus comprising a plurality of pixels, wherein each pixel of the plurality of pixels includes:
- a first electrode;
- a second electrode on the first electrode, the second electrode including silver and magnesium;
- an organic emission layer between the first electrode and the second electrode; and
- a mixed layer between the organic emission layer and the second electrode, the mixed layer including a metal and a barrier material.

67. The organic light emitting display apparatus as claimed in claim 66, wherein the metal contains at least one selected from the group of ytterbium, samarium, calcium, strontium, europium, terbium, barium, lanthanum, and cesium.

68. The organic light emitting display apparatus as claimed in claim 66, wherein the barrier material includes a fluoride.

69. The organic light emitting display apparatus as claimed in claim 68, wherein the fluoride includes at least one selected from the group of $LiF$, $CaF_2$, $NaF_2$ and $AlF_3$.

70. The organic light emitting display apparatus as claimed in claim 66, wherein the barrier material includes an oxide.

71. The organic light emitting display apparatus as claimed in claim 70, wherein the oxide includes at least one selected from the group of $CaO$, $LiO$, $MgO$, $ZnO$, and ITO.

72. The organic light emitting display apparatus as claimed in claim 66, wherein the barrier material includes a halogen-containing compound.

73. The organic light emitting display apparatus as claimed in claim 66, wherein a weight percent of silver in the second electrode is greater than a weight percent of magnesium in the second electrode.

74. The organic light emitting display apparatus as claimed in claim 66, further comprising a buffer layer, the buffer layer being between the second electrode and the organic emission layer.

75. The organic light emitting display apparatus as claimed in claim 74, wherein the buffer layer is closer to the organic emission layer than the mixed layer is to the organic emission layer.

76. The organic light emitting display apparatus as claimed in claim 74, wherein the buffer layer includes a fluoride.

77. The organic light emitting display apparatus as claimed in claim 76, wherein the fluoride includes at least one selected from the group of $LiF$, $CaF_2$, $NaF_2$ and $AlF_3$.

78. The organic light emitting display apparatus as claimed in claim 74, wherein the buffer layer includes an oxide.

79. The organic light emitting display apparatus as claimed in claim 78, wherein the oxide includes at least one selected from the group of $CaO$, $LiO$, $MgO$, $ZnO$, and ITO.

80. The organic light emitting display apparatus as claimed in claim 74, wherein the buffer layer includes a chloride.

81. The organic light emitting display apparatus as claimed in claim 80, wherein the chloride includes $RbCl$.

82. The organic light emitting display apparatus as claimed in claim 74, wherein the buffer layer includes an organic material.

* * * * *